(12) United States Patent
Lu et al.

(10) Patent No.: US 10,115,464 B1
(45) Date of Patent: Oct. 30, 2018

(54) ELECTRIC FIELD TO REDUCE SELECT GATE THRESHOLD VOLTAGE SHIFT

(71) Applicant: SanDisk Technologies LLC, Plano, TX (US)

(72) Inventors: Ching-Huang Lu, Fremont, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/699,490

(22) Filed: Sep. 8, 2017

Related U.S. Application Data

(60) Provisional application No. 62/537,568, filed on Jul. 27, 2017.

(51) Int. Cl.
| | | |
|---|---|---|
| *G11C 16/08* | (2006.01) | |
| *G11C 16/04* | (2006.01) | |
| *G11C 16/12* | (2006.01) | |
| *G11C 16/24* | (2006.01) | |
| *G11C 16/28* | (2006.01) | |
| G11C 16/34 | (2006.01) | |

(52) U.S. Cl.
CPC ............ *G11C 16/08* (2013.01); *G11C 16/04* (2013.01); *G11C 16/12* (2013.01); *G11C 16/24* (2013.01); *G11C 16/28* (2013.01); *G11C 16/3459* (2013.01)

(58) Field of Classification Search
CPC ......... G11C 16/04; G11C 16/08; G11C 16/12; G11C 16/24; G11C 16/26; G11C 16/28; G11C 16/3459
USPC .............. 365/185.17, 185.18, 185.19, 185.2, 365/185.21, 185.26
See application file for complete search history.

(56) References Cited

U.S. PATENT DOCUMENTS

| | | |
|---|---|---|
| 5,815,438 A | 9/1998 | Haddad et al. |
| 6,373,748 B2 | 4/2002 | Ikehashi et al. |
| 6,982,905 B2 | 1/2006 | Nguyen |
| 8,004,900 B2 | 8/2011 | Dutta et al. |
| 8,804,425 B2 | 8/2014 | Chen et al. |
| 9,087,601 B2 | 7/2015 | Dutta et al. |
| 9,336,892 B1 | 5/2016 | Chen et al. |

(Continued)

OTHER PUBLICATIONS

International Search Report & The Written Opinion of the International Searching Authority dated Aug. 9, 2018, International Application No. PCT/US2018/032524 filed May 14, 2018.

*Primary Examiner* — Tan T Nguyen
(74) *Attorney, Agent, or Firm* — Vierra Magen Marcus LLP

(57) ABSTRACT

Non-volatile storage systems and method of operating non-volatile storage systems are disclosed. A crept up voltage on a dummy memory cell control gate adjacent to a select gate is prevented, reduced, and/or discharged. In some aspects, the crept up voltage is not allowed to happen on the dummy memory cell next to the select gate after a sensing operation. In some aspects, the voltage may creep up on the dummy memory cell control gate after a sensing operation, but it is discharged. Reducing and/or preventing the crept up voltage may reduce the electric field between the dummy memory cell and select gate transistor. This may prevent, or at least reduce, changes in threshold voltage of the select gate transistor. Additional problems may also be solved by a reduction of the crept up voltage on the dummy memory cell control gates.

20 Claims, 20 Drawing Sheets

(56) References Cited

U.S. PATENT DOCUMENTS

| | | |
|---|---|---|
| 9,443,605 B1 | 9/2016 | Chen et al. |
| 9,620,233 B1 | 4/2017 | Dong et al. |
| 9,704,587 B1 * | 7/2017 | Park .................... G11C 16/24 |
| 2010/0238729 A1 | 9/2010 | Lee et al. |
| 2017/0103999 A1 * | 4/2017 | Lee ...................... G11C 16/08 |

* cited by examiner

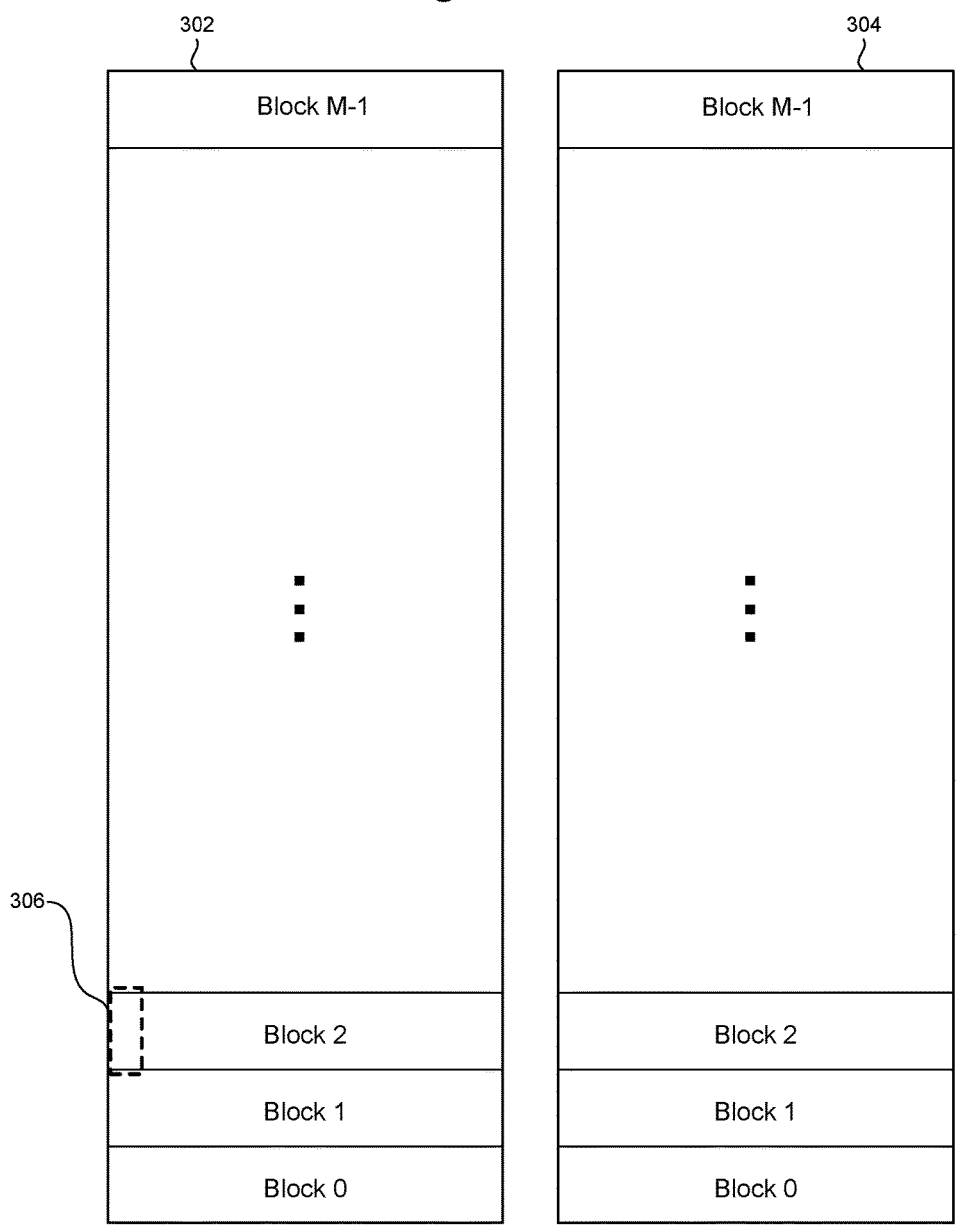

Fig. 4D
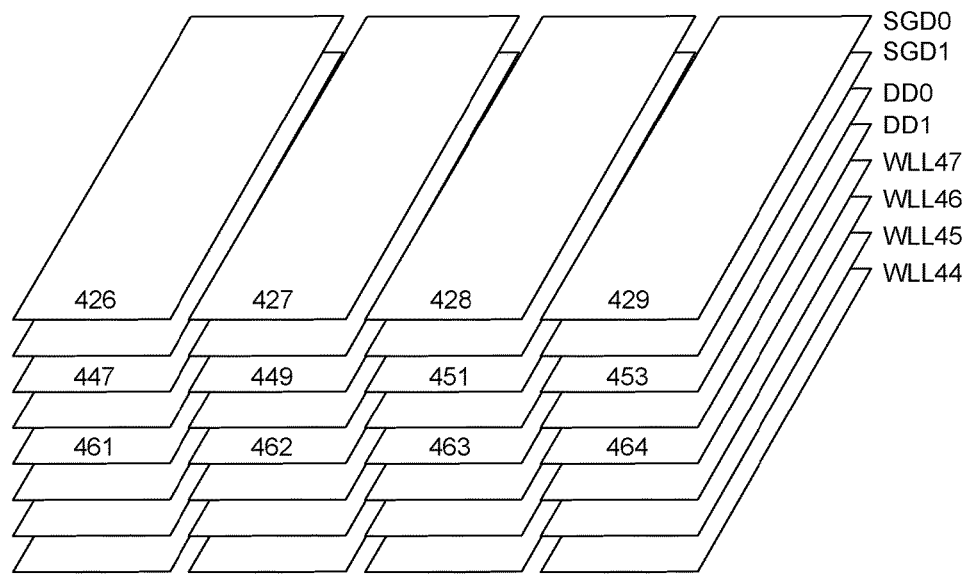
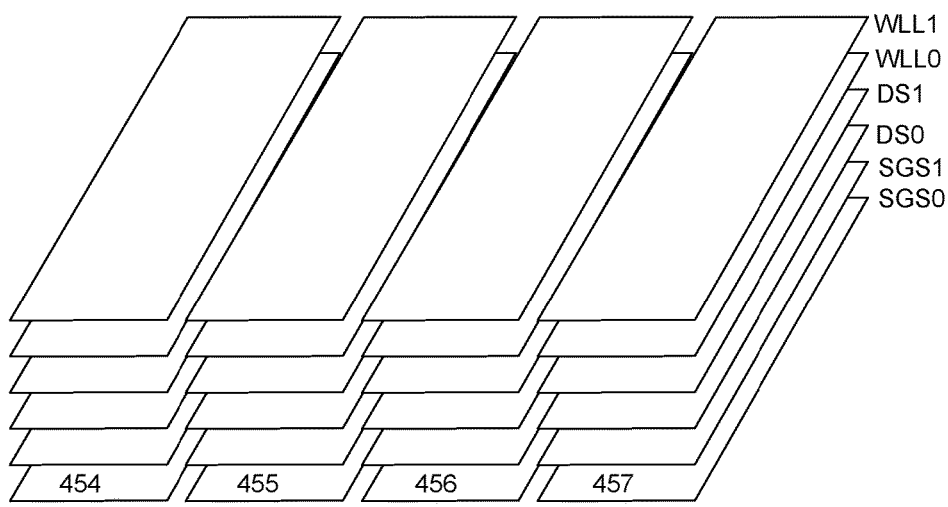

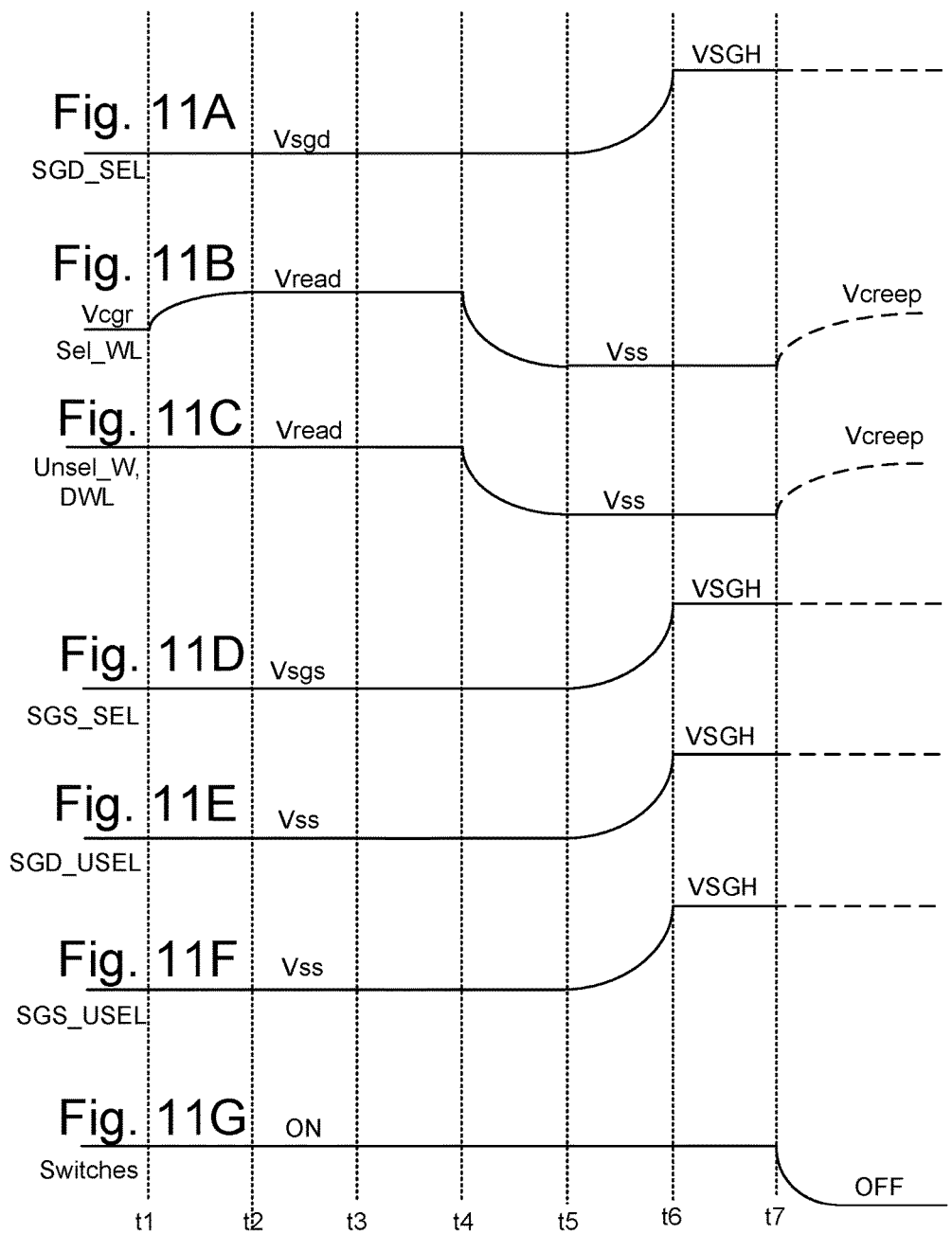

ELECTRIC FIELD TO REDUCE SELECT GATE THRESHOLD VOLTAGE SHIFT

CLAIM OF PRIORITY

The present application claims priority to U.S. Provisional Application No. 62/537,568, entitled "METHODS OF CREATING DUMMY-SG LATERAL FIELD TO SLOW DOWN HOLE MOVEMENT AND REDUCE SGD VT DOWNSHIFT," filed Jul. 27, 2017, which is herein incorporated by reference in its entirety.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. The data can then be read back and provided in response to read requests. It is important that data stored in a memory system is not lost. Performance of the memory system, such a speed of operation, is also important to hosts, clients, users, etc.

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIGS. 11A-11G depict timing a signals during one embodiment of process 1000.

DETAILED DESCRIPTION

Non-volatile storage systems and method of operating non-volatile storage systems are disclosed. It is possible for a voltage on a control gate of a memory cell adjacent to a select transistor to creep up after a sensing operation. This crept up voltage could create an electric field between the memory cell and the select transistor. This electric field could result in a permanent change in the threshold voltage of the select transistor.

Embodiments disclosed herein generate an electric field between a select transistor and a memory cell adjacent to the select transistor, after a sensing operation. In some embodiments, after a sensing operation, a voltage on a control gate of the select transistor is increased. The control gate of the select transistor and the control gate of the memory cell adjacent to the select transistor are then floated. This may generate an electric field between the memory cell and the select transistor. The electric field may prevent, or at least reduce, permanent change to the threshold voltage of the select transistor that could occur following the sensing operation. The electric field may solve other technological problems.

Some embodiments are practiced in a memory device in which memory cells have a charge storage region comprising a charge-trapping material such as silicon nitride or other nitride, etc. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films may include a charge-trapping layer which extends vertically along an individual cell or an entire NAND string, a tunneling layer and a channel layer. Some of the conductive layers are used as control gates (or word lines) for memory cells and other conductive layers are used as control gates for select gate transistors, such as drain or source-side transistors in NAND strings. In some embodiments, the charge-trapping material is used in memory cells in 2D NAND.

Figure 1A:
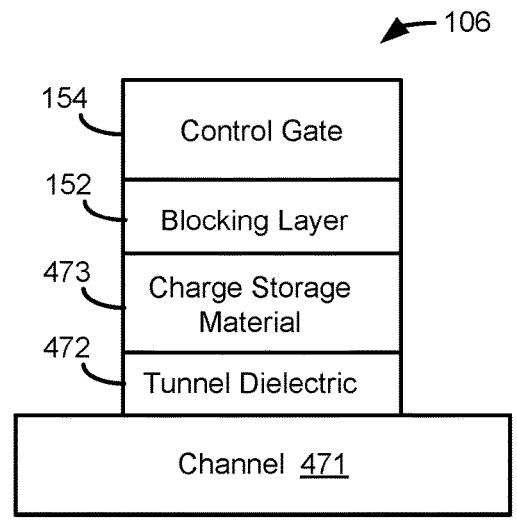
FIG. 1A shows a memory cell.

FIG. 1A shows a memory cell 106 having a control gate 154, dielectric blocking layer 152, charge storage region 473, tunnel dielectric layer 472, and channel 471. The memory cell may also be referred to as a "memory cell transistor," as it may operate as a transistor. The memory cell may be one of many memory cells on a string (e.g., NAND string). The string of memory cells may share the channel 471. The string of memory cells could be in a 3D memory array or a 2D memory array. A sensing operation may be used to determine a threshold voltage of an individual memory cell.

Figure 1B:
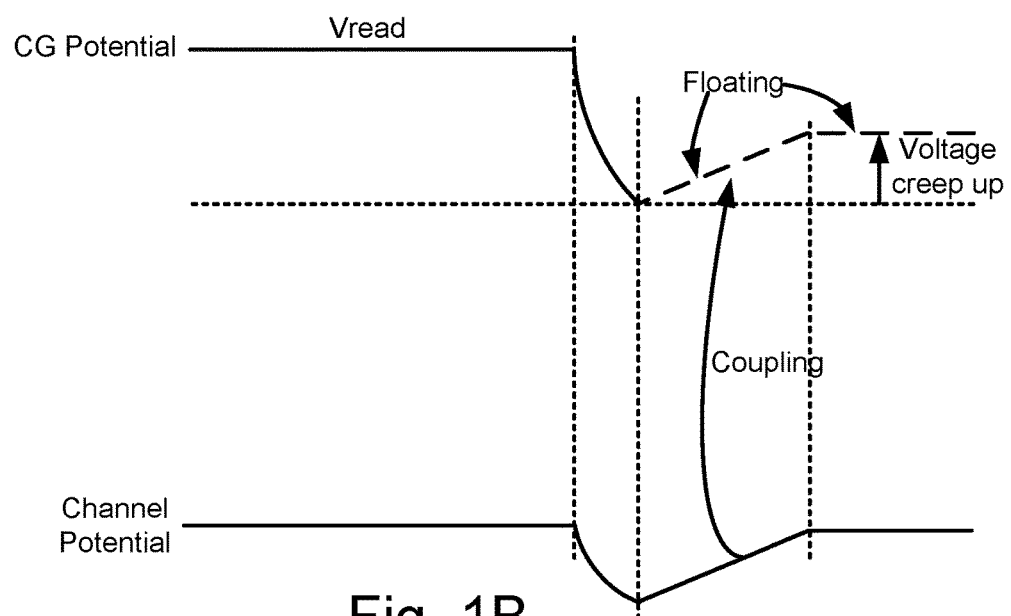
FIG. 1B shows a timing diagram of a voltage applied to memory cell control gates (CG) during a sensing operation, as well as the channel voltage.

FIG. 1B shows a timing diagram of a voltage applied to memory cell control gates (CG) during a sensing operation, as well as the channel voltage. The sensing operation could be, for example, a read or a program verify. The sensing operation typically includes applying a read pass voltage (e.g., Vread) to control gates of unselected memory cells on a string while applying a reference voltage (e.g., Vcgr) to the control gate of the memory cell that has been selected for sensing (e.g., "selected memory cell"). The unselected memory cells may include "dummy memory cells". A dummy memory cell does not store host data (data provided from the host, such as data from a user of the host), while a data memory cell is eligible to store host data.

The reference voltage might be a read reference voltages for a read operation, a verify voltage for a program verify operation, etc. In some embodiments, after the selected memory cell has been sensed, its control gate voltage is raised to a read pass voltage. Thus, all of the control gate of all of the memory cells on the string may be at the read pass voltage near the end of the sensing operation. A read pass voltage is a voltage that is sufficient to place the memory cell into a conductive state, assuming that its threshold voltage is within a range of threshold voltages assigned to different data states. It is not required that the read pass voltage have the same magnitude for all memory cells on the string, but that is one possibility.

During the sensing operation, various memory cells on the string may be in a conductive state. Hence, there may be electrons in the channel. As depicted in FIG. 1B, after sensing the selected memory cell, the control gate voltages may be discharged from the read pass voltage down to a lower voltage. This lower voltage could be at or near a steady state voltage (e.g., Vss). During this discharge, it is possible for some of the electrons to remain in some portions of the channel. As depicted in FIG. 1B, after the memory cell control gates have been discharged to the lower voltage, the memory cell control gates may be floated. It is possible for capacitive coupling between the channel and the memory cell control gates to cause the voltage on the memory cell control gates to creep up after the sensing operation.

Figure 1C:
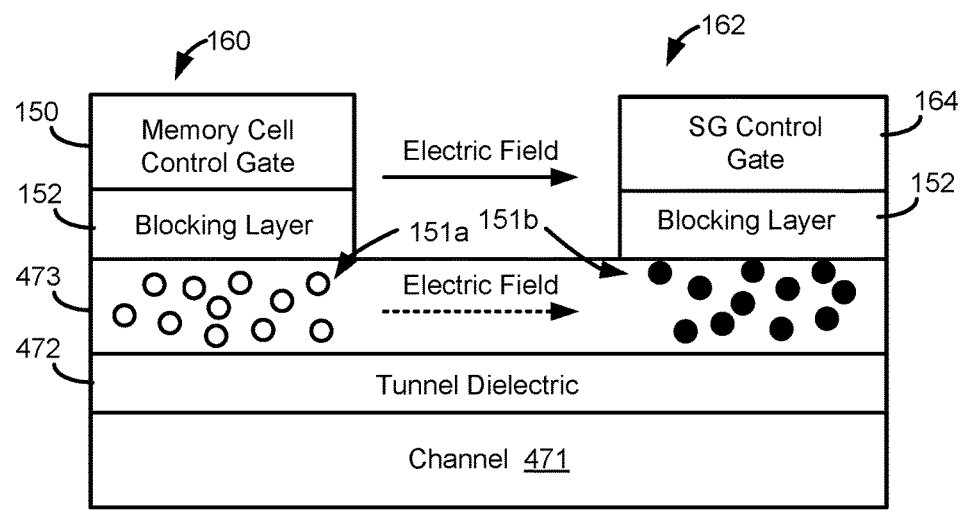
FIG. 1C shows a portion of a string of memory cells, having a select gate.

FIG. 1C shows a portion of a string of memory cells, having a select gate. FIG. 1C is used to illustrate a technological problem that could occur after sensing a memory cell on the string. FIG. 1C shows just one memory cell 160 and one select gate 162. Typically, there are many memory cells on string. In some cases, there is one select gate at each end of the string. In some architectures, these are referred to a drain select gate and a source select gate. Note that each select gate may include one or more transistors. In the example of FIG. 1C, the select gate 162 has a single transistor, and hence may alternatively be referred to as a select transistor 162. The string is a NAND string, in one embodiment. The memory cell 160 is adjacent to the select transistor 162, by which is meant that there are no other memory cells on the string between memory cell 160 and select transistor 162.

In the example of FIG. 1C, the charge storage material 473 is a contiguous region shared by the memory cell 160 and select gate 162. FIG. 1C shows charges 151a in the charge storage material 473 adjacent to the memory cell control gate 154 and charges 151b in the charge storage material 473 adjacent to the select transistor control gate 164. The charges 151a adjacent to the memory cell control gate 154 are white to indicate that these charges may be holes. The threshold voltage of the memory cell transistor may be controlled by the amount of charge in the charge storage material 473 adjacent to the memory cell control gate. Likewise, the threshold voltage of the select transistor 162 may be controlled by the amount of charge in the charge storage material 473 adjacent to the select transistor control gate 164.

The charges 151b adjacent to the select transistor control gate 164 are black to indicate that these charges may be electrons. One possibility is for the memory cell next to the select transistor to be in an erased state, although this is not required. In some cases, the memory cell adjacent to the select gate is a dummy memory cell, which is typically not used to store data.

FIG. 1C depicts a case in which there is an electric field between the memory cell control gate 154 and select transistor control gate 164. One possible cause for the electric field is that the memory cell control gate 154 may be at a higher potential than the select transistor control gate 164. This condition could happen if the voltage on the memory cell control gate 154 were to creep up after a sensing operation, assuming that the select transistor control gate 164 is at a lower voltage than the crept up voltage. Note that the select transistor control gate 164 could be at some low potential, such as ground or close to ground, for proper operation.

This electric field may extend into the charge storage material 473, as indicated in FIG. 1C. The electric field could possibly lead to a reduction in the net charge in the charge storage material 473 adjacent to the select transistor control gate 164. For example, holes adjacent to the memory cell could possible move in the electric field to portion of the charge storage material 473 adjacent to the select transistor 162. Therefore, the threshold voltage of the select transistor 162 could be altered. For example, the threshold voltage of the select transistor 162 could be reduced. A reduction of the threshold voltage of the select transistor 162 could adversely impact performance of memory array operations. One possible adverse impact is that a technique that inhibits program of unselected strings might become less effective. Hence, memory cells on unselected strings might suffer program disturb.

Figure 1D:
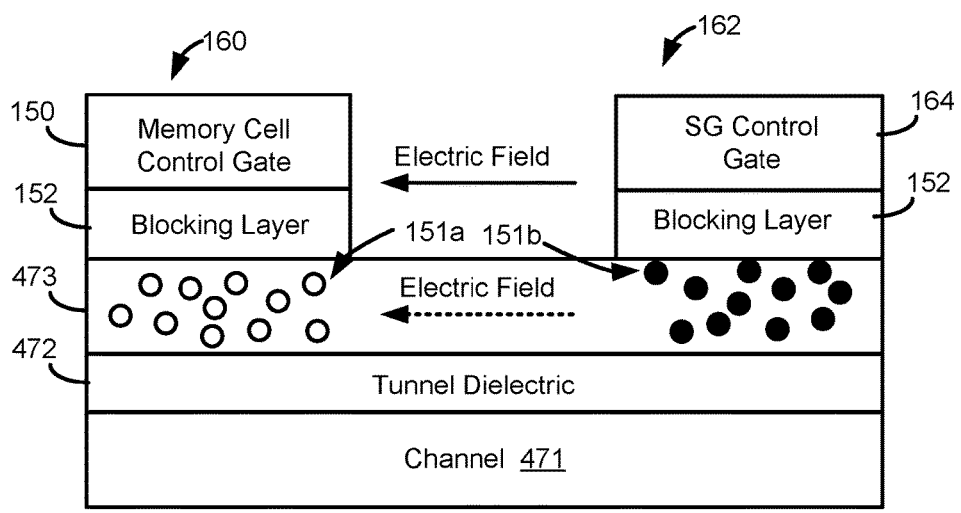
FIG. 1D shows the same memory cell and select gate as FIG. 1C, but with a different electric field.

Some embodiments disclosed herein generate an electric field between a select transistor and a memory cell adjacent to the select transistor, after a sensing operation. FIG. 1D shows the same memory cell 160 and select gate 162 as FIG. 1C, but with a different electric field. The electric field in FIG. 1D is in the opposite direction as the electric field in FIG. 1C. The electric field in FIG. 1D may prevent, or at least slow down, movement of holes from under the memory cell control gate 154 to the region of the charge trapping material 473 under the select transistor control gate 164. Therefore, the electric field can prevent, or at least reduce, change to the threshold voltage of the select transistor 162. Additional problems may also be solved by the electric field in FIG. 1D.

In some embodiments, the electric field in FIG. 1D is created by causing the voltage on the control gate 164 of the select transistor 162 to be greater than the voltage on the control gate 150 of the memory cell 160. The voltage on the memory cell control gate 154 may be a crept up voltage that follows sensing of a memory cell on the string. In some embodiments, a control circuit increases a voltage on the select transistor control gate 164 to at least a magnitude of voltage to which the memory cell control gate 154 will creep up to following the sensing operation. The control circuit may float both the select gate control gate 164 and the memory cell control gate 154 after increasing the voltage on the select gate control gate 164. The electric field depicted in FIG. 1D may occur while the select transistor control gate 164 and the memory cell control gate 154 are floating.

Figure 2A:
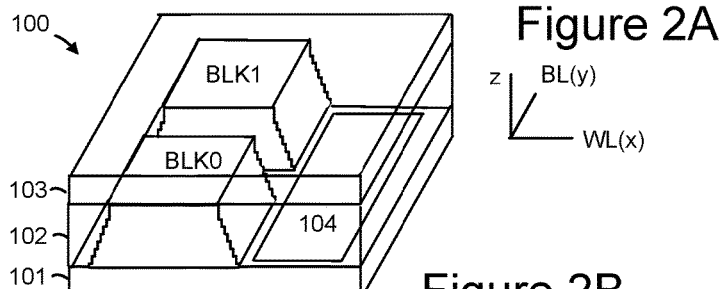
FIG. 2A is a perspective view of a 3D stacked non-volatile memory device.

FIGS. 2A-4F describe one example of a memory system that can be used to implement the technology proposed herein. FIG. 2A is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2B:
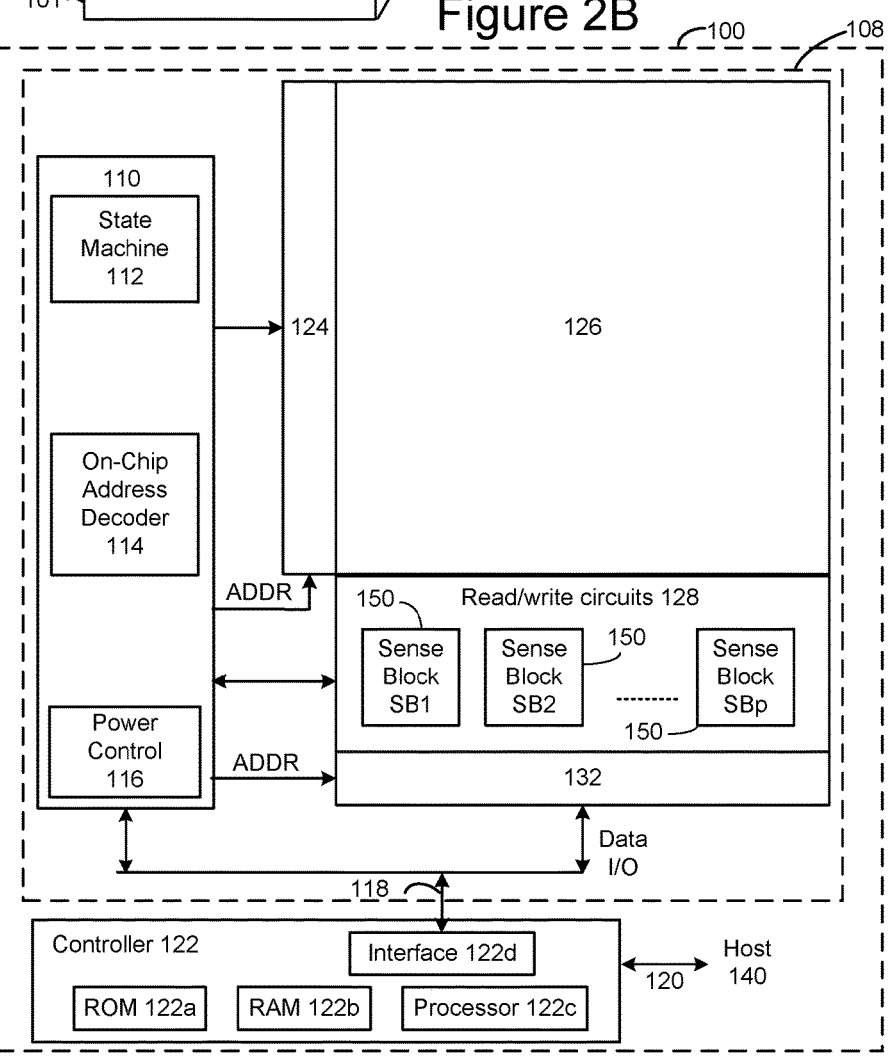
FIG. 2B is a functional block diagram of a memory device such as the 3D stacked non-volatile memory device 100 of FIG. 2A.

FIG. 2B is a functional block diagram of an example memory device such as the 3D stacked non-volatile memory device 100 of FIG. 2A. The components depicted in FIG. 2B are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write circuits 128 to perform memory operations (e.g., erase, program, read, and others) on memory structure 126, and includes a state machine 112, an on-chip address decoder 114, a power control module 116. The state machine 112 provides die-level control of memory operations. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, power control module 116, sense blocks 150, read/write circuits 128, and controller 122 can be considered a control circuit that performs the functions described herein.

The (on-chip or off-chip) controller 122 (which in one embodiment is an electrical circuit) may comprise one or more processors 122c, ROM 122a, RAM 122b, Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
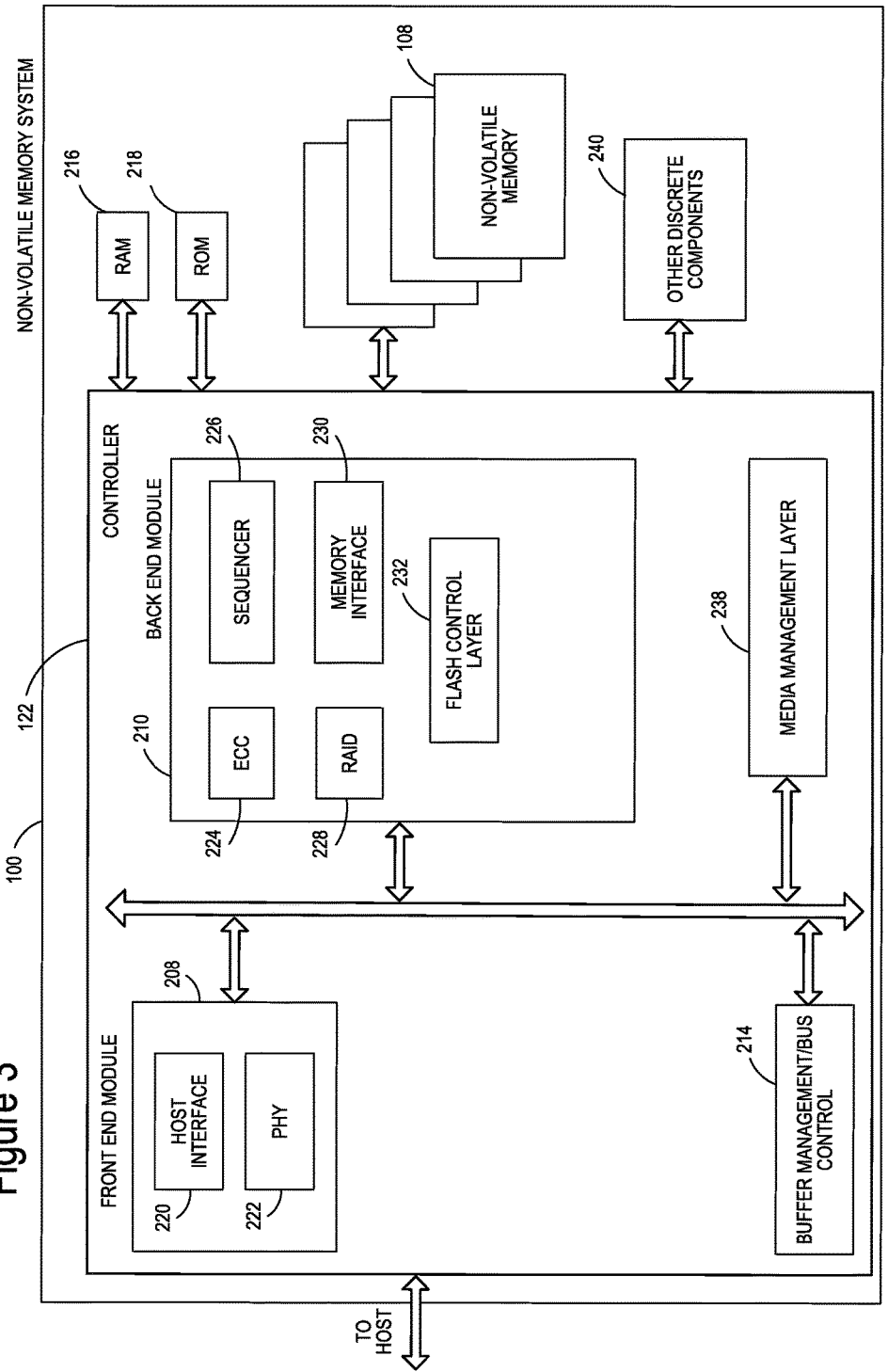
FIG. 3 is a block diagram depicting one embodiment of a memory system.

FIG. 3 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 122 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, laptop, tablet, etc. Additionally, the SSD need not be made to work as a hard drive.

Figure 3A:
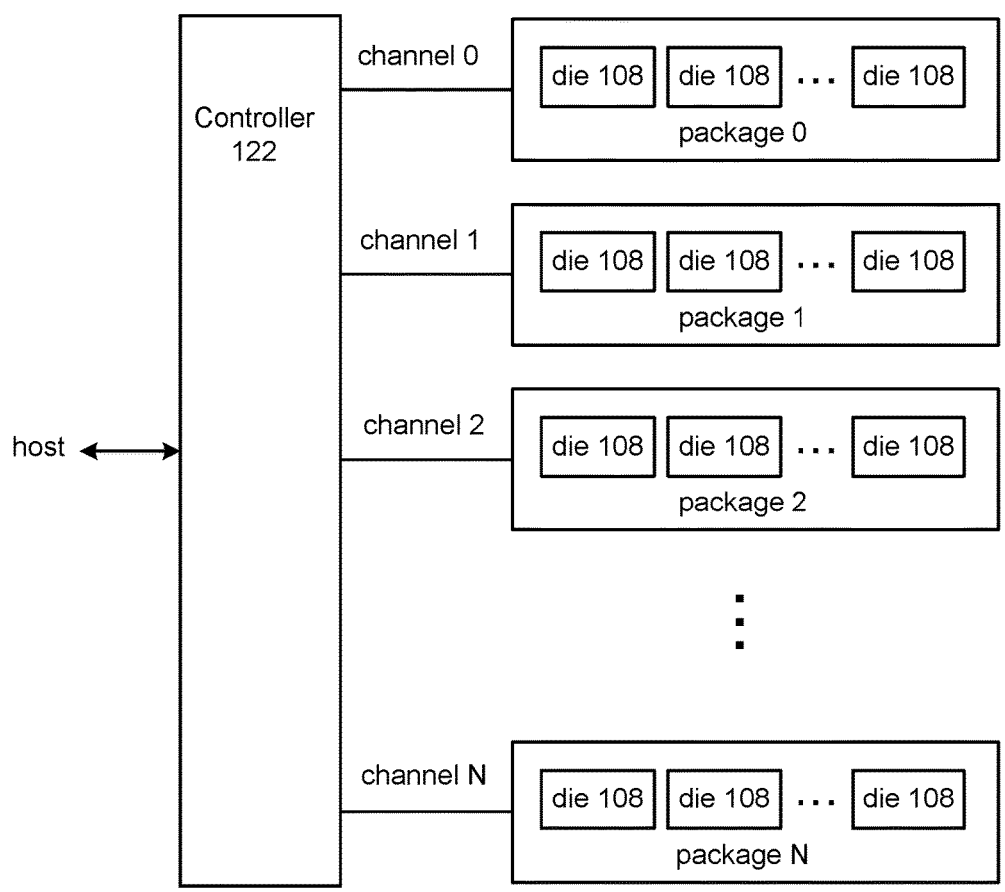
FIG. 3A is a block diagram depicting one embodiment of a memory system.

Some embodiments of a non-volatile storage system will include one memory die 108 connected to one controller 122. However, other embodiments may include multiple memory die 108 in communication with one or more controllers 122. In one example, depicted in FIG. 3A, the multiple memory die can be grouped into a set of memory packages. Each memory package includes one or more memory die in communication with controller 122. FIG. 6 shows N+1 memory packages (package 0-package N), and N+1 channels (channel 0-channel N) for communication between controller 122 and the memory dies 108 of respective memory packages 0-N. In one embodiment, a memory package includes a printed circuit board (or similar structure) with one or more memory die 108 mounted thereon. In some embodiments, a memory package can include molding material to encase the memory dies 108 of the memory package. In one embodiment, a memory package can be a single memory die 108. In some embodiments, controller 122 is physically separate from any of the memory packages.

Figure 4:
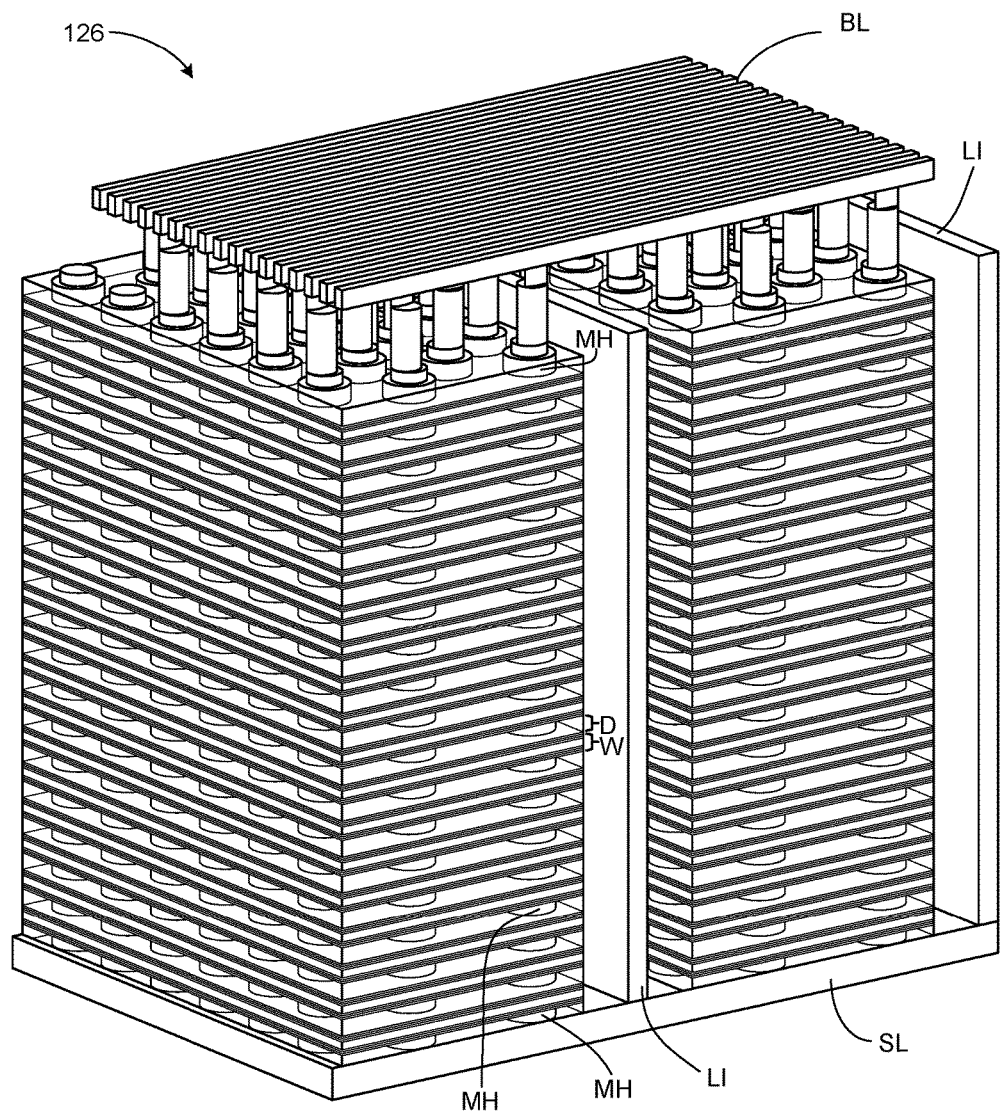
FIG. 4 is a perspective view of a portion of one embodiment of a monolithic three dimensional memory structure.

FIG. 4 is a perspective view of a portion of one example embodiment of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
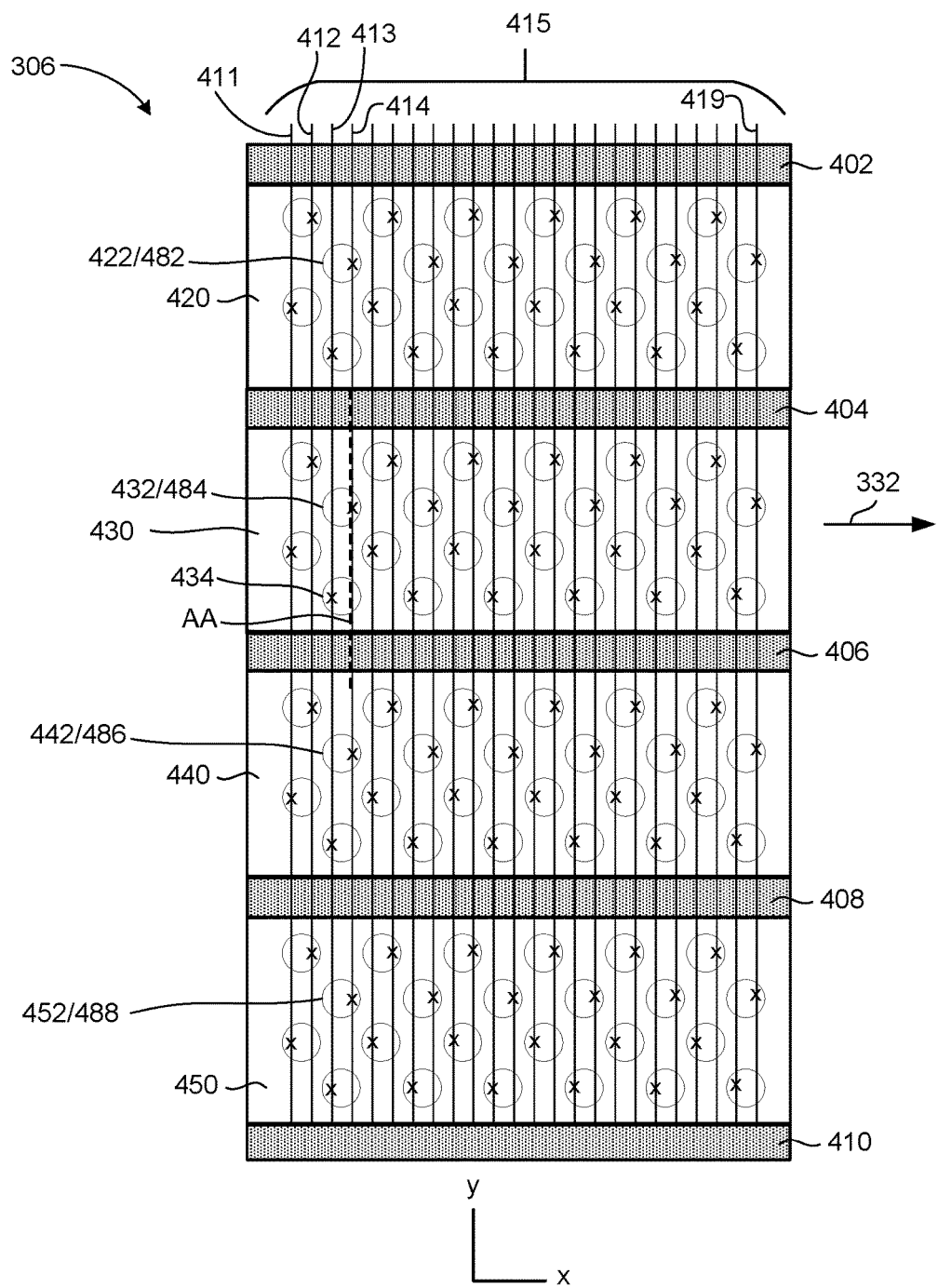
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
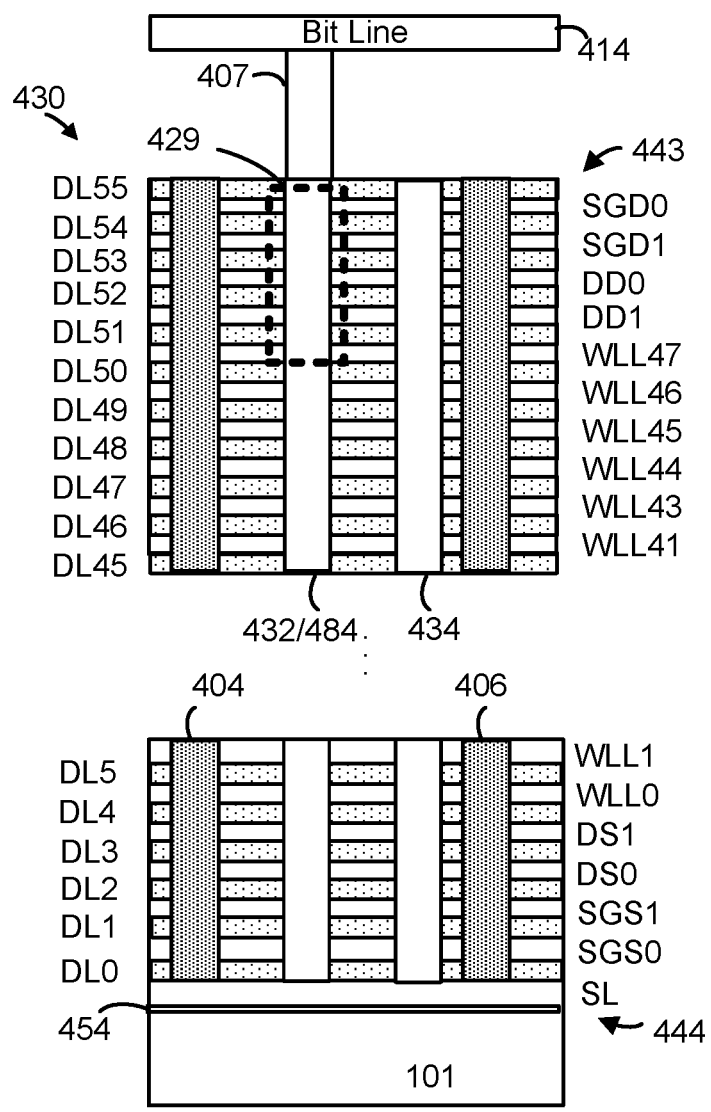
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes two drain side select layers SGD0 and SGD1; two source side select layers SGS0 and SGS1; four dummy word line layers DD0, DD1, DS0 and DS1; and forty eight data word line layers WLL0-WLL47 for connecting to data memory cells. Other embodiments can implement more or fewer than two drain side select layers, more or fewer than two source side select layers, more or fewer than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 407. Local interconnects 404 and 406 are also depicted.

For ease of reference, drain side select layers SGD0 and SGD; source side select layers SGS0 and SGS1; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL55. For example, dielectric layers DL47 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4D depicts a logical representation of the conductive layers (SGD0, SGD1, SGS0, SGS1, DD0, DD1, DS0, DS1, and WLL0-WLL47) for the block that is partially depicted in FIG. 4C. The SGD layers SGD0 and SGD0 each includes parallel rows of select gate lines associated with the drain-side of a set of NAND strings. For example, SGD0 includes drain-side select gate regions 426, 427, 428 and 429. As mentioned above with respect to FIG. 4B, in one embodiment local interconnects 402, 404, 406, 408 and 410 break up each conductive layers into four regions or fingers. In one embodiment, the four select gate regions on a same level are connected together. In another embodiment, each select gate region operates as a separate select line.

Below the SGD layers are the drain-side dummy word line layers. Each dummy word line layer represents a word line, in one approach, and is connected to a set of dummy memory cells at a given height in the stack. For example, DD0 comprises word line layer regions 447, 449, 451 and 453. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy word line layers are the data word line layers. For example, WLL47 comprises word line layer regions 461, 462, 463 and 464, consistent with FIG. 4A. Below the data word line layers are the source-side dummy word line layers DS1 and DS0.

Below the source-side dummy word line layers are the SGS layers. The SGS layers SGS0 and SGS1 each includes parallel rows of select gate lines associated with the source-side of a set of NAND strings. For example, SGS0 includes source-side select gate lines 455, 456, 457 and 458. Each select gate line can be independently controlled, in one approach. Or, the select gate lines can be connected and commonly controlled.

Figure 4E:
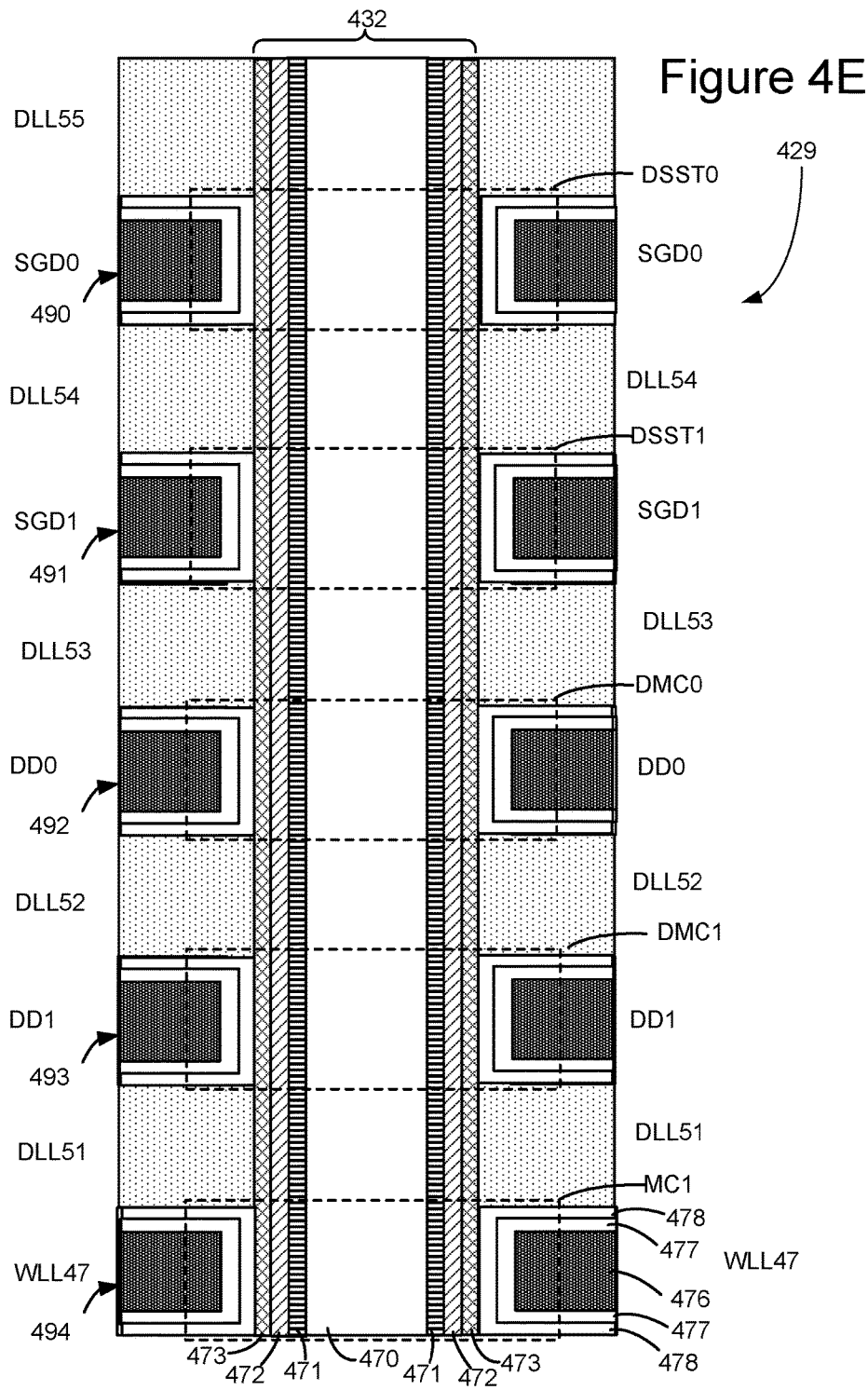
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or fewer than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL51, DLL52, DLL53, DLL54, and DLL55, as well as word line layer WLL47, dummy word line layers DD0 and DD1, and drain side select layers SGD0 and SGD1. Each of the conductive layers (WLL47, DD0, DD1, SGD0, and SGD1) includes a conductive region 476 surrounded by an aluminum oxide layer 477, which is surrounded by a blocking oxide (Sift) layer 478. Note that the portion of a conductive layers that is adjacent the vertical column 432 may be considered to be a control gate 154 of a memory cell 160 or control gate 164 of a select gate 162. Aluminum oxide layer 477 and/or blocking oxide (Sift) layer 478 are one example of blocking layer 152. The physical interaction of the word line layers with the vertical column forms the memory cells and select gate. Thus, a memory cell, in one embodiment, comprises channel 471, tunneling dielectric 472, charge trapping layer 473, blocking oxide layer 478, aluminum oxide layer 477 and word line region 476. For example, a portion of word line layer WLL47 and a portion of vertical column 432 comprise a memory cell MC1. A portion of dummy word line layer DD1 and a portion of vertical column 432 comprise a dummy memory cell DMC1. A portion of dummy word line layer DD0 and a portion of vertical column 432 comprise a dummy memory cell DMC0. In one embodiment, a portion of conductive layer SGD1 and a portion of vertical column 432 comprise a drain side select transistor DSST1. In one embodiment, a portion of conductive layer SGD0 and a portion of vertical column 432 comprise a drain side select transistor DSST0. In some embodiments, conductive layers SGD1 and SGD0 are electrically connected (connected not depicted in FIG. 4E). In other architectures, a select gates and memory cells may have a different structure.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell may be increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Note that both data and dummy memory cells may be programmed. In some embodiments, the dummy memory cells are erased, and stay in the erased state during operation of the memory array. Hence, dummy memory cells could have a low threshold voltage. Moreover, the dummy memory cells could have a significant number of holes in their charge trapping layer.

Also note that the select gate transistors can also be programmed in a manner similar to programming the memory cells. In some embodiments, the select gate transistors are programmed to have a target threshold voltage for optimal memory array operation. Embodiments disclosed herein prevent or reduce undesired changes in the threshold voltages of the select gate transistors.

Figure 4F:
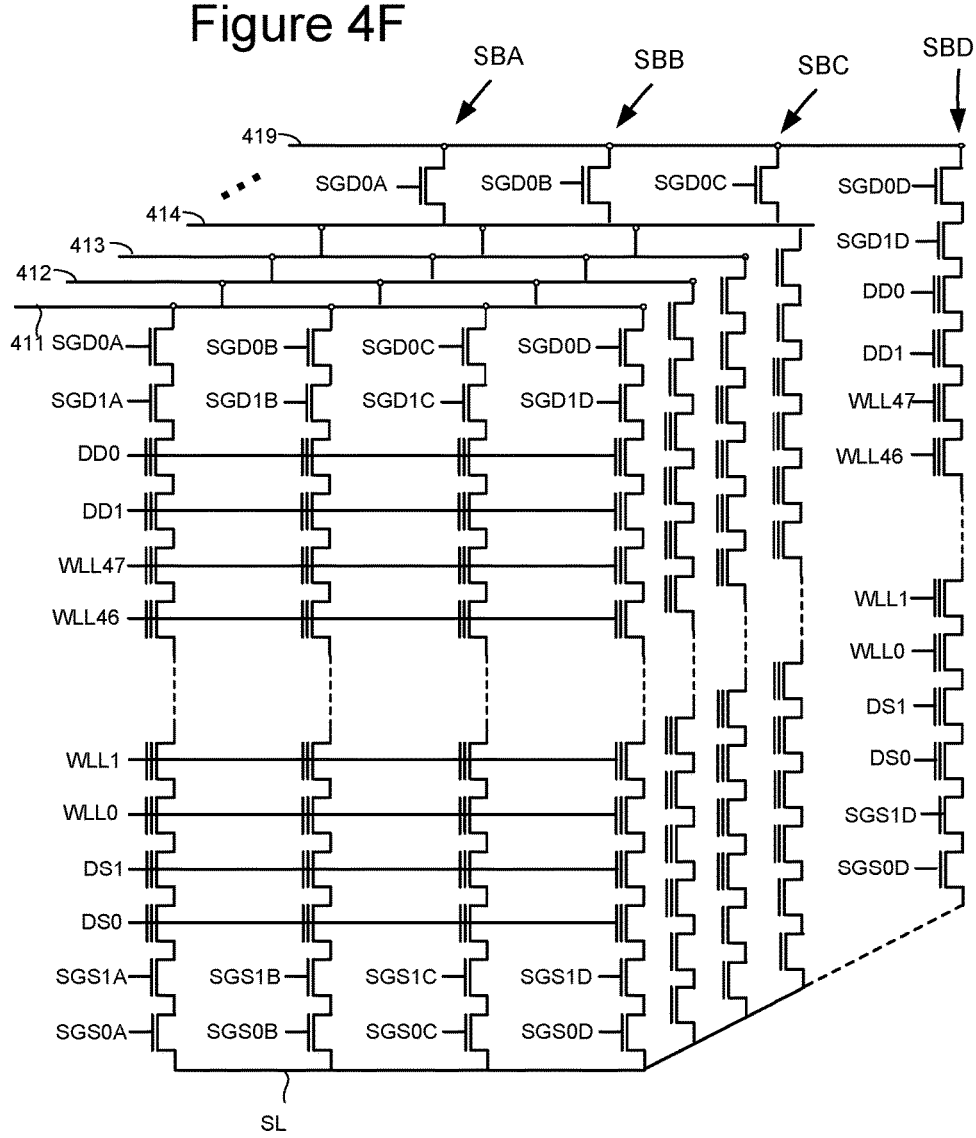
FIG. 4F is a schematic of a plurality of NAND strings.

FIG. 4F shows physical word lines WLL0-WLL47 running across the entire block. Physical dummy word lines DD0 and DD1 also run across the entire block. The structure of FIG. 4F corresponds to portion 306 in Block 2 of FIGS. 4A-4B, including bit lines 411, 412, 413, 414, . . . 419. Within the block, each bit line connects to four NAND strings. Drain side selection lines SGD are used to determine which of the four NAND strings connect to the associated bit line. The block can also be thought of as divided into four sub-blocks SBA, SBB, SBC and SBD.

Sub-block SBA corresponds to those vertical NAND strings controlled by SGD0A, SGD1A, SGS1A and SGS0A. Note that SGD0A and SGD1A may have the same voltages applied thereto. For example, SGD0A and SGD1A may be connected electrically (although this is not required). Likewise, SGS0A and SGS1A may have the same voltages applied thereto. For example, SGS0A and SGDSA may be connected electrically (although this is not required).

Sub-block SBB corresponds to those vertical NAND strings controlled by SGD0B, SGD1B, SGS1B and SGS0B. Note that SGD0B and SGD1B may have the same voltages applied thereto. For example, SGD0B and SGD1B may be connected electrically (although this is not required). Likewise, SGS0B and SGS1B may have the same voltages applied thereto. For example, SGS0B and SGDSB may be connected electrically (although this is not required).

Sub-block SBC corresponds to those vertical NAND strings controlled by SGD0C, SGD1C, SGS1C and SGS0C. Note that SGD0C and SGD1C may have the same voltages applied thereto. For example, SGD0C and SGD1C may be connected electrically (although this is not required). Likewise, SGS0C and SGS1C may be controlled together. For example, SGS0C and SGDSC may be connected electrically (although this is not required).

Sub-block SBD corresponds to those vertical NAND strings controlled by SGD0D, SGD1D, SGS1D and SGS0D. Note that SGD0D and SGD1D may have the same voltages applied thereto. For example, SGD0D and SGD1D may be connected electrically (although this is not required). Likewise, SGS0D and SGS1D may be controlled together. For example, SGS0D and SGS1D may be connected electrically (although this is not required).

Note that each SGD0A may correspond to region 426 in FIG. 4D. Likewise, each SGD0B may correspond to region 427 in FIG. 4D. Likewise, each SGD0C may correspond to region 428 in FIG. 4D. Likewise, each SGD0D may correspond to region 429 in FIG. 4D. Note that each SGS0A may correspond to region 455 in FIG. 4D. Likewise, each SGS0B may correspond to region 455 in FIG. 4D. Likewise, each SGS0C may correspond to region 456 in FIG. 4D. Likewise, each SGS0D may correspond to region 457 in FIG. 4D.

Additionally note that various memory cells are depicted has having two "gates" in the schematic diagram of FIG. 4F. One of the memory cell gates is a control gate 154, the other "gate" refers to the charge trapping region 473. The select transistors are depicted as having a single gate (e.g., control gate 164) to help show the distinction between the select gates and memory cells. Note that the select transistors may also have a charge trapping region. Moreover, this charge trapping material could be shared with the memory cells. For example, FIG. 1C shows charge trapping material 473 as a contiguous region shared by the memory cell 160 and select gate 162. Likewise, FIG. 4E depicts charge trapping material 473 as a contiguous region shared by the data memory cell MC1, dummy memory cells DMC1, DMC2, and select gate transistors SGD1, SGD0.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figure 5:
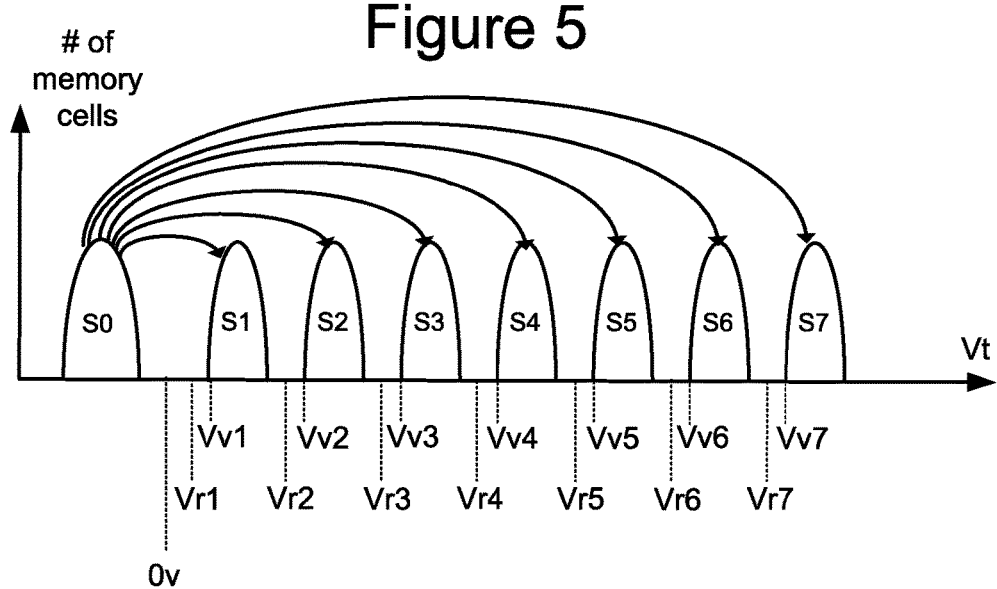
FIG. 5 depicts threshold voltage distributions.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, andVr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

Figure 6A:
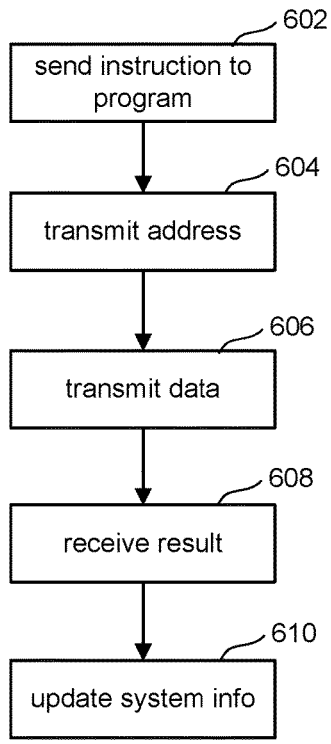
FIG. 6A is a flow chart describing one embodiment of a process for programming.

FIG. 6A is a flowchart describing one embodiment of a process for programming that is performed by controller 122. In some embodiments, rather than have a dedicated controller, the host can perform the functions of the controller. In step 602, controller 122 sends instructions to one or more memory die 108 to program data. In step 604, controller 122 sends one or more addresses to one or more memory die 108. The one or more logical addresses indicate where to program the data. In step 606, controller 122 sends the data to be programmed to the one or more memory die 108. In step 608, controller 122 receives a result of the programming from the one or more memory die 108. Example results include that the data was programmed successfully, an indication that the programming operation failed, and indication that the data was programmed but at a different location, or other result. In step 610, in response to the result received in step 608, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 602, controller 122 would receive host data and an instruction to program from the host, and the controller would run the ECC engine 224 to create code words from the host data, as known in the art and described in more detail below. These code words are the data transmitted in step 606. Controller can also scramble the data to achieve wear leveling with respect to the memory cells.

Figure 6B:
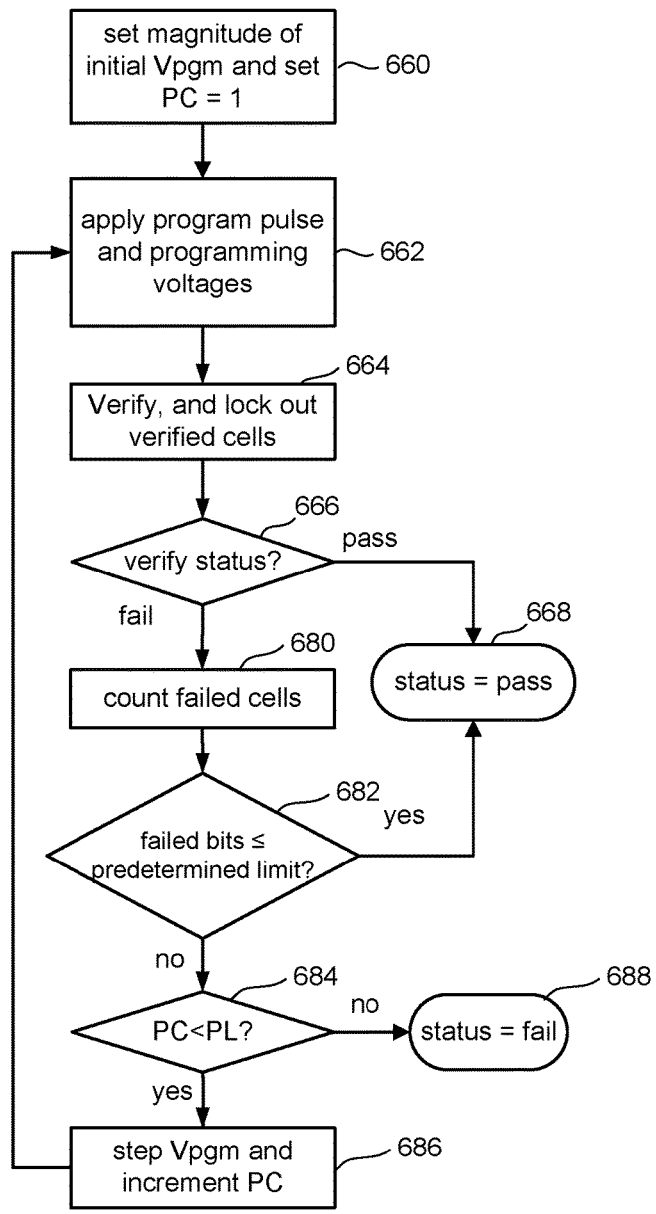
FIG. 6B is a flow chart describing one embodiment of a process for programming.

FIG. 6B is a flowchart describing one embodiment of a process for programming. The process of FIG. 6B is performed by the memory die in response to the steps of FIG. 6A (i.e., in response to the instructions, data and addresses from controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of FIG. 6B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 660 of FIG. 6B, the programming voltage (Vpgm) is initialized to the starting magnitude (e.g., ~12-16V or another suitable level) and a program counter PC maintained by state machine 112 is initialized at 1. In step 662, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~6-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 662, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 664, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 666, it is determined whether all the memory cells have reached their target threshold voltages (pass). If so, the programming process is complete and successful because all selected memory cells were programmed and verified to their target states. A status of "PASS" is reported in step 668. If, in 666, it is determined that not all of the memory cells have reached their target threshold voltages (fail), then the programming process continues to step 680.

In step 680, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 682, it is determined whether the count from step 680 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 668. In this situation, enough memory cells programmed correctly such that the few remaining memory cells that have not been completely programmed can be corrected using ECC during the read process. In some embodiments, step 680 will count the number of failed cells for each sector, each target data state or other unit, and those counts will individually or collectively be compared to a threshold in step 682.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 684 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 688. This is one example of a program fault. If the program counter PC is less than the program limit value PL, then the process continues at step 686 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 686, the process loops back to step 662 and another program pulse is applied to the selected word line so that another iteration (steps 662-686) of the programming process of FIG. 6B is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, word line units, blocks, jumbo blocks, or other units.

Figure 7A:
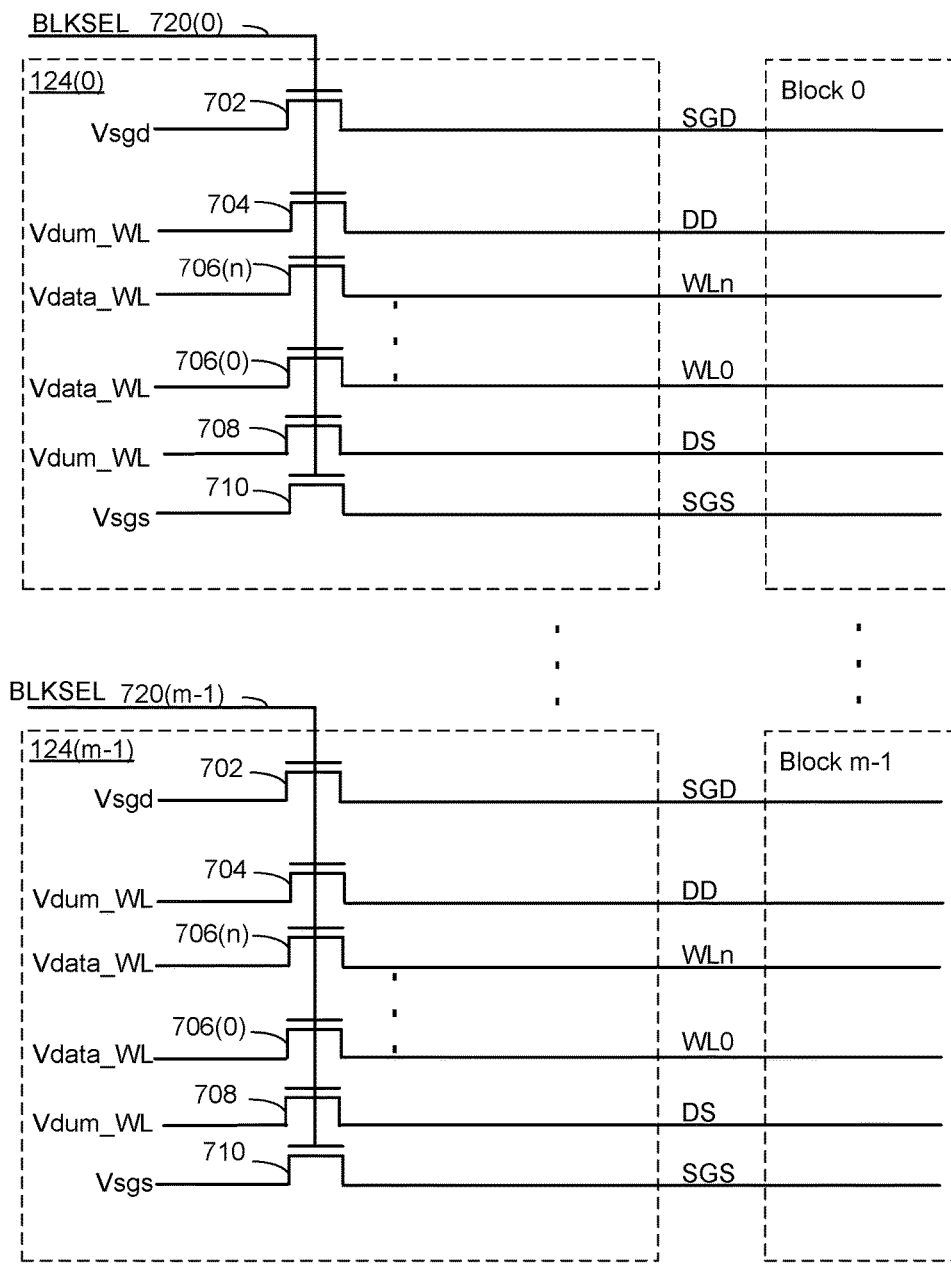
FIG. 7A is a simplified schematic diagram of one embodiment of a row decoder.

FIG. 7A is a simplified schematic diagram of one embodiment of a row decoder 124 that provides voltages to blocks (Block 0 . . . Block m−1) of memory cells. The blocks may be all in the same plane, as in the example of FIG. 4A. Each block has a number of conductive lines (SGD, DD, WLL0-WLLn, DS, and SGS). The conductive lines are a simplification of some of the architectural examples presented herein. Note that term "line" is being used because of the common use of the terms "select line" and "word line." However, it will be appreciated that the conductive "lines" are not limited to a geometric line, but may have a variety of geometric shapes. The conductive lines could alternatively be referred to as conductive regions. The row decoders 124 have transistors 702, 704, 706, 708, 710 to provide voltages to the conductive lines. By providing the voltages to the conductive lines, the voltages are provided to control gates of data memory cells, dummy memory cells, and select transistors, as the case may be.

A block select lines (BLKSEL 720) is used to control the transistors 702-710. In this example, one pair of block select lines (BLKSEL 720, BLKSELn 722) are associated with each block. To select a block, BLKSEL 720 may be high. This may turn on transistors 702-710, depending on voltages applied to the other terminals. For an unselected block, BLKSEL 720 may be low. This may turn off transistors 702-710, depending on voltages applied to the other terminals. Note that typically only one block in a plane is selected at a time.

Figure 7B:
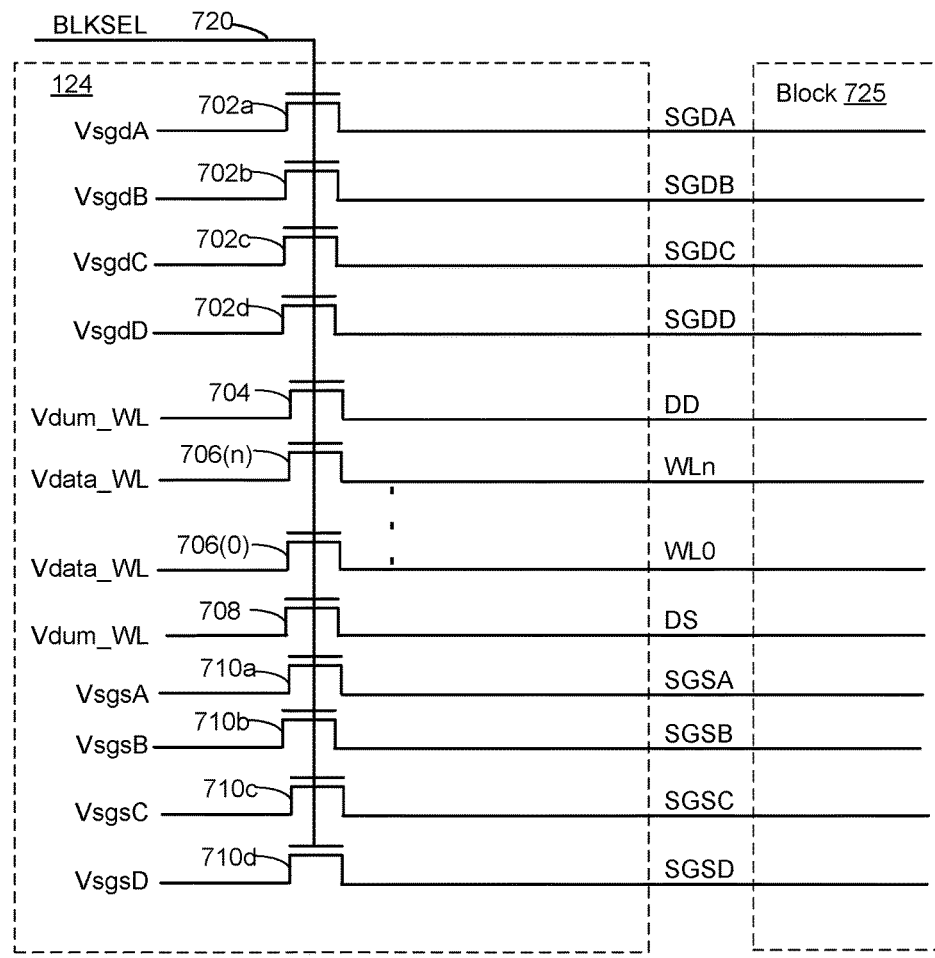
FIG. 7B is a simplified schematic diagram of one embodiment of a row decoder that provides voltages to a block of memory cells.

To provide select gate voltage Vsgd to conductive line SGD, BLKSEL 720 may be used to turn on drain select gate (or select line) switch transistor 702, while providing Vsgs to the drain of switch transistor 702. As noted, SGD is a simplification of architectural examples presented herein. SGD could represent SGD0 or SGD1 in FIG. 4C or 4D. As another example, SGD could represent SGD0A, SGD0B, SGD0C or SGD0D in FIG. 4F. In some embodiments, one select gate line (in a selected block) is selected, while others (in the selected block) are unselected. For example, with reference to FIG. 4F, SDG0A can be selected while SDG0B, SDG0C, and SDG0D are unselected. At the same time, SDG1A can be selected while SDG1B, SDG1C, and SDG1D are unselected. Thus, a row decoder 124 could have additional switch transistors 702 to provide other select gate voltages Vsgd to other select gate lines in a block. FIG. 7B depicts one embodiment having additional switch transistors 702.

Referring now to FIG. 7A, to provide dummy word line voltage Vdum_WL to conductive line DD, BLKSEL 720 may be used to turn on drain dummy word line switch transistor 704, while providing Vdum_WL to the drain of switch transistor 704. The drain dummy word line switch transistor 704 may also be referred to as a drain dummy control gate switch transistor 704, or more briefly as drain dummy switch transistor 704. Conductive line DD could represent dummy word line layer DD0 or DD1, with respect to FIGS. 4C-4F. To provide dummy word line voltage Vdum_WL to conductive line DS, BLKSEL 720 may be used to turn on source dummy switch transistor 708, while providing Vdum_WL to the drain of switch transistor 708. Conductive line DS could represent dummy word line layer DS0 or DS1, with respect to FIGS. 4C-4F. Thus, a row decoder 124 could have additional switch transistors 704, 708 to provide voltages to other dummy word lines in a block.

To provide data word line voltage Vdata_WL to one of conductive lines WL0-WLn, BLKSEL 720 may be used to turn data word line switch transistors 706(0)-706(n), while providing Vdata_WL to the respective drains of switch transistors 706(0)-706(n). The data word line switch transistors 706 may also be referred to as data control gate switch transistors 706, or more briefly as data switch transistors 706. The magnitude of Vdata_WL can be different for the different data word lines. Conductive lines WL0-WLn could represent word line layers WLL0-WLL47, with respect to FIGS. 4C-4F.

To provide select gate voltage Vsgs to conductive line SGS, BLKSEL 720 may be used to turn on source select gate (or select line) switch transistor 710, while providing Vsgs to the drain of switch transistor 710. SGS could represent SGS0 or SGS1 in FIG. 4C or 4D. As another example, SGS could represent SGS0A, SGS0B, SGS0C or SGS0D in FIG. 4F. In some embodiments, one select gate line (in a selected block) is selected, while others (in the selected block) are unselected. For example, with reference to FIG. 4F, SGS0A can be selected while SGS0B, SGS0C, and SGS0D are unselected. At the same time, SGS1A can be selected while SGS1B, SGS1C, and SGS1D are unselected. Thus, a row decoder 124 could have additional switch transistors 710 to provide other select gate voltages VSGS to other select gate lines in a block.

The various switch transistors 702-710 are used to implement switches to provide voltages to the conductive lines in the respective block. In this example, a single transistor is depicted for the switch for each conductive line. However, more than one transistor, as well as other circuit elements could be included in the switch for each conductive line.

Note that a switch that provides voltages to a data word line could alternatively be referred to as a data word line switch, a data memory cell control gate switch, or more simply as a data control gate switch. Likewise, a switch that provides a voltage to a dummy word line could alternatively be referred to as a dummy word line switch, a dummy memory cell control gate switch, or more simply as a dummy control gate switch. Also, a switch that provides voltages to a select line could alternatively be referred to as a select line switch, a select transistor control gate switch, or as a select gate control gate switch.

Note that in some cases, the switches in the row decoder 124 may operate such that the conductive lines are at a floating voltage. In some embodiments, a transistor in a row decoder is turned off to float a conductive line in a block. In one embodiment, transistors 706(0) to 706(n) are turned off to float the data word lines WL0-WLn. In one embodiment, transistor 704 and/or 708 is turned off to float dummy word line DD and/or DS. In one embodiment, transistor 702 is turned off to float the drain side select line SGD. In one embodiment, transistor 708 is turned off to float source side select line SGS. The transistors may be turned off by applying a suitable voltage to the gate of the transistor via BLKSEL 720, in one embodiment. It will be apparent that floating a conductive line in a block may float a control gate that is electrically connected to the conductive line.

FIG. 7B is a simplified schematic diagram of one embodiment of a row decoder 124 that provides voltages to conductive lines in a block 725 of memory cells. This embodiments differs from the one of FIG. 7A in that switch transistors are depicted for additional select lines. Switch transistor 702a provides a voltage to conductive line SGDA; switch transistor 702b provides a voltage to conductive line SGDB; switch transistor 702c provides a voltage to conductive line SGDC; and switch transistor 702d provides a voltage to conductive line SGDD. Referring to FIG. 4F, conductive line SGDA could be SGD0A and/or SGD1A; conductive line SGDB could be SGD0B and/or SGD1B; conductive line SGDC could be SGD0C and/or SGD1C; conductive line SGDD could be SGD0D and/or SGD1D. In some embodiments, the same voltage is provided to SGD0A and SGD1A. Likewise, the same voltage may be provided to SGD0B and SGD1B, etc.

Switch transistor 710a provides a voltage to conductive line SGSA; switch transistor 710b provides a voltage to conductive line SGSB; switch transistor 710c provides a voltage to conductive line SGSC; and switch transistor 710d provides a voltage to conductive line SGSD. Referring to FIG. 4F, conductive line SGSA could be SGS0A and/or SGS1A; conductive line SGSB could be SGS0B and/or SGS1B; conductive line SGSC could be SGS0C and/or SGS1C; conductive line SGSD could be SGS0D and/or SGS1D. In some embodiments, the same voltage is provided to SGS0A and SGS1A. Likewise, the same voltage may be provided to SGS0B and SGS1B, etc.

Figure 8:
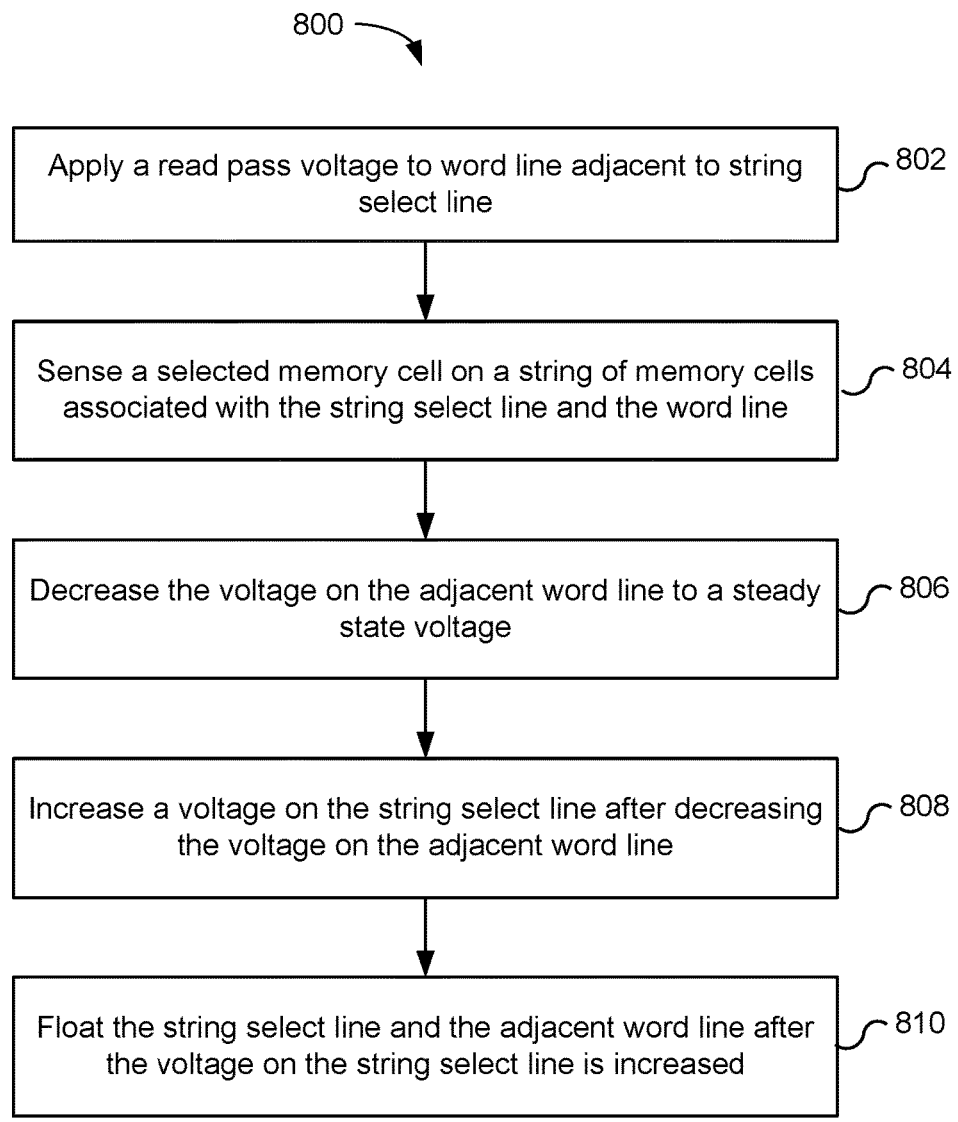
FIG. 8 is a flowchart of one embodiment of a process 800 of operating non-volatile storage.

FIG. 8 is a flowchart of one embodiment of a process 800 of operating non-volatile storage. The process 800 may be used to generate an electric field between a select transistor and a memory cell adjacent to the select transistor, after a sensing operation. Process 800 may be used to generate an electric field between a select line and a word line adjacent to the select line, after a sensing operation. Process 800 could be used to generate an electric field at a drain end, a source end, or both drain and source ends of a string of memory cells. The string may be a NAND string. In one embodiment, the NAND string is in a 3D memory array, such as the examples provided herein. Process 800 may be performed by a control circuit, which may include but is not limited to: control circuitry 110, state machine 112, decoders 114/124/132, power control module 116, sense blocks 150, read/write circuits 128, and controller 122.

Step 802 includes applying a read pass voltage to a word line adjacent to a string select line (or more simply "adjacent word line"). By the word line being adjacent to the string select line it is meant that there are no other word lines between the word line and the string select line. With reference to FIG. 4C-4E, the adjacent word line could be DD0 and the string select line could be SGD1. Note that in some embodiments, the same voltage is applied to SGD1 and SGD0. With reference to FIG. 4F, the adjacent word line could be DD0 and the string select line could be any of SGD1A, SGD1B, SGB1C, and/or SGD1D. In some embodiments, the adjacent word line is a dummy word line.

Note that the string select line may be connected to a control gate of a string select transistor. Note that the adjacent word line may be connected to a control gate of a memory cell adjacent to the string select transistor (or more simply "adjacent memory cell"). By "adjacent memory cell" it is meant that there are no other memory cells between the adjacent memory cell and the string select transistor. With reference to FIG. 4E, the adjacent memory cell could be DMC0 and the string select transistor could be DSST1. Hence, step 802 may include applying the read pass voltage to the control gate of the adjacent memory cell. In some embodiments, the adjacent memory cell is a dummy memory cell.

Step 802 may also include applying a voltage to the string select line while applying a read pass voltage to the adjacent word line. The string select line could be a selected string select line or an unselected string select line in a selected block. For example, assume the sub-block SBD in FIG. 4F is selected and sub-blocks SBA, SBB, and SBC are unselected. The adjacent word line could be DD0 and the selected string select line could be SGD1D. Note that in some embodiments, the same voltage is applied to SGD1D and SGD0D. The adjacent word line could be DD0 and the unselected string select line could be SGD1A, SGD1B and/or SGD1C. Since the string select line may be electrically connected to a control gate of a string select transistor, step 802 may include applying a voltage to the control gate of a string select transistor.

Step 804 includes sensing a selected memory cell on the string of memory cells. The sensing could be a verify operation during a program operation, or a read operation. Step 804 may include circuitry in a sense block 150 sensing a condition of the selected memory cell, such as a current that flows in the bit line. In one embodiment, the conduction current of the selected memory cell is measured to determine whether the selected memory cell turned on (conducted current) in response to a read reference voltage applied to the control gate of the selected memory cell. During embodiment of a read or verify process, control gates of unselected memory cells are provided with a read pass voltage at their control gates so that these memory cells will operate as pass gates (e.g., conducting current regardless of whether they are programmed or erased). The control gates of dummy memory cells also receive a read pass voltage.

Step 806 includes decreasing the voltage on the adjacent word line from the read pass voltage to a steady state voltage. Note that step 806 may result in decreasing the voltage on the control gate of the adjacent memory cell from the read pass voltage to a steady state voltage. In one embodiment, the steady state voltage is about ground (e.g., Vss). As one example, the voltage on DD0 is dropped to the steady state voltage.

Step 808 includes increasing a voltage on the string select line, after decreasing the voltage on the adjacent word line to the steady state voltage. The voltage may be increased while the steady state voltage is still on the adjacent word line. Step 808 may result in increasing a voltage on the control gate of the select transistor. In one embodiment, step 808 includes increasing the voltage on the string select line to at least a creep up voltage to which the word line adjacent to the select gate creeps up to after the word line adjacent to the select gate is floated in step 810.

Step 808 includes increasing a voltage on a selected string select line, in one embodiment. With reference to the example of FIG. 4F in which sub-block SBD is selected, the voltage on SGD1D may be increased. Note that SGD0D may receive the same voltage as SGD1D.

Step 808 includes increasing a voltage on an unselected string select line in a selected block, in one embodiment. With reference to the example of FIG. 4F in which sub-block SBD is selected, the voltage on (unselected) SGD1A may be increased. Note that SGD0A may receive the same voltage as SGD1A. As another example, the voltage on (unselected) SGD1B may be increased. Note that SGD0B may receive the same voltage as SGD1B. As another example, the voltage on (unselected) SGD1C may be increased. Note that SGD0C may receive the same voltage as SGD1C.

Step 810 includes floating the string select line and the adjacent word line after the voltage on the string select line is increased. In one embodiment, step 808 includes floating the string select line at a higher voltage than a voltage at which the adjacent word line floats. In one embodiment, step 808 includes floating the control gate of a string select transistor at a higher voltage than a voltage at which the control gate of the adjacent memory cell floats. Note that the string select transistor and the adjacent memory cell may be on a string having the selected memory cell. However, the string select transistor and the adjacent memory cell may be on an unselected string in the same block as a selected string.

Step 810 may result in an electric field between the string select line and the adjacent word line. Step 810 may result in an electric field between a string select transistor and the adjacent memory cell. Step 810 may result in an electric field between the control gate of the string select transistor and the control gate of the adjacent memory cell.

Figure 9:
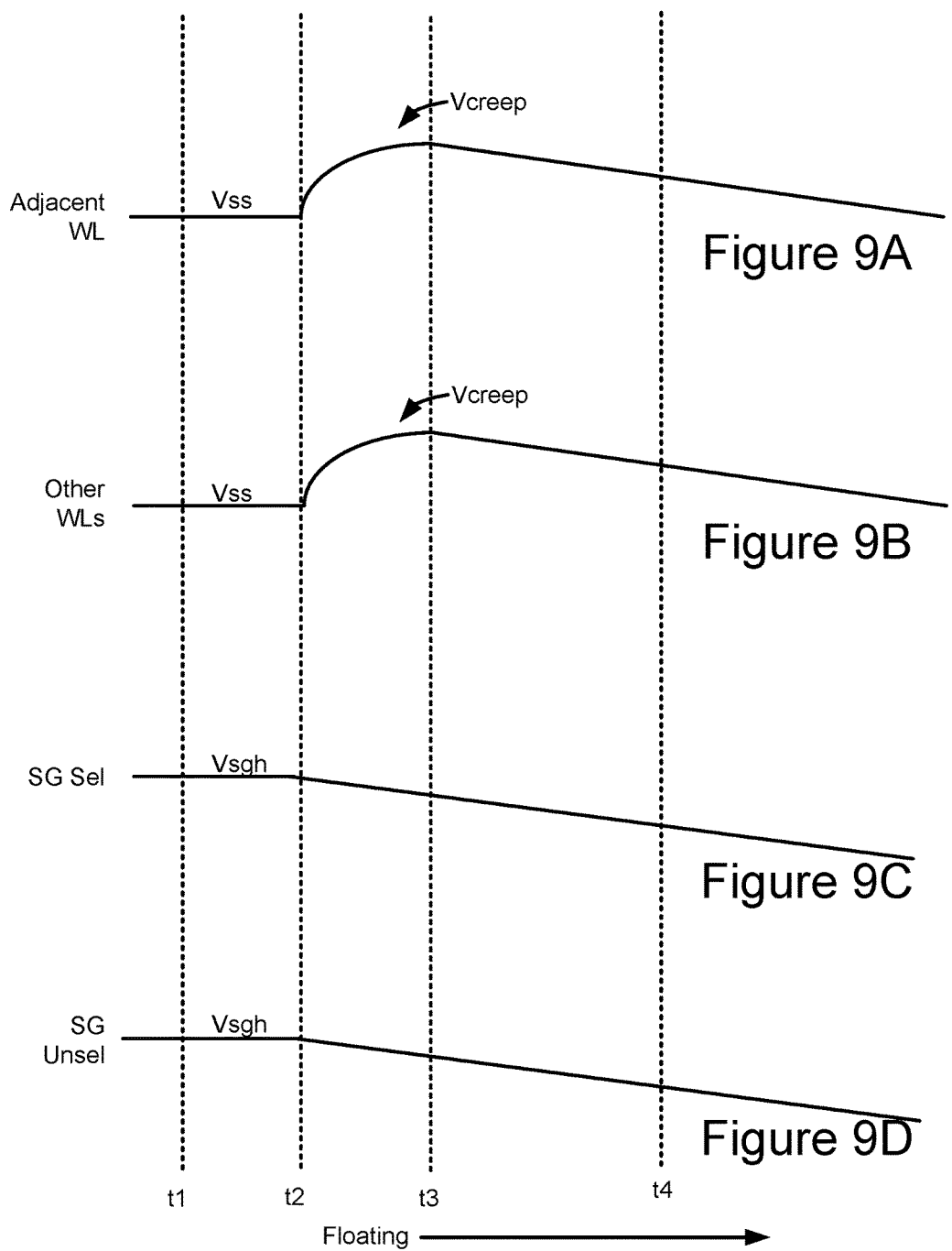
FIGS. 9A-9D show example voltages on word lines and select lines for one embodiment of process 800.

FIGS. 9A-9D show example voltages on word lines and select lines for one embodiment of process 800. FIG. 9A shows voltages for the adjacent word line. FIG. 9B shows voltages for other word lines. FIG. 9C shows voltages for a select line connected to a selected NAND string. For example, FIG. 9C shows voltages for a select line in a selected sub-block. FIG. 9D shows voltages for select lines connected to unselected NAND strings that share a bit line with the selected NAND string. For example, FIG. 9D shows voltages for a select line an unselected sub-block.

Time t1 corresponds to conditions after step 808 of one embodiment of process 800. FIG. 9A shows that at time t1, the adjacent word line is at Vss. In one embodiment, Vss is ground. In one embodiment, the adjacent word line is a dummy word line. Referring again to the example of FIG. 4F, the adjacent word line could be DD0. FIG. 9B shows that at time t1, the other word lines are also at Vss. Referring again to the example of FIG. 4F, the other word lines could be DS0, DS1, WWL0-WLL47 and DD1. FIG. 9C shows that at time t1, the selected select line is at Vsgh. Referring again to the example in which sub-block SBD is selected, the selected select line could be SGD1D. Note the SGD0D may also be driven to Vsgh. FIG. 9D shows that at time t1, the unselected select lines are also at Vsgh. Referring again to the example in which sub-block SBD is selected, the unselected select lines could be SGD1A, SGD1B, and SGD1C. Note the SGD0A, SGD0B, and SGD0C may also be driven to Vsgh. Note that at time t1, the various conductive lines are being driven.

Time t2 corresponds to conditions when floating of the various conductive lines begins. Note that the voltage on the adjacent word line and the other word lines creeps up after the word lines are floated. This is referred to herein as a "creep up voltage." After time t3, the voltage on the word lines may slowly discharge. Note that this discharge could occur very slowly. For example, it may take the word lines tens of minutes to discharge to about Vss. It is possible for the voltage on the select lines to also slowly discharge.

Note that the magnitude of Vsgh is at least as great as a maximum value of Vcreep, in some embodiments. In FIGS. 9A and 9B, Vcreep is at its maximum at time t3. As depicted in FIGS. 9A-9D, Vsgh might drop slightly between t2 and t3. However, Vsgh is still greater than Vcreep at time t3, in one embodiment. Thus, the voltage on SGD1D is at least as high as the voltage on DD0 at time t3, in some embodiments. The voltage on SGD1A is at least as high as the voltage on DD0 at time t3, in some embodiments. The voltage on SGD1B is at least as high as the voltage on DD0 at time t3, in some embodiments. The voltage on SGD1C is at least as high as the voltage on DD0 at time t3, in some embodiments. Therefore, an electric field such as depicted in FIG. 1D may be generated. Hence, the threshold voltage of the various select transistors may be preserved.

Moreover, the voltage on the select lines may stay higher than Vcreep for a substantial period of time. Time t4 represents an arbitrary point in time at which Vcreep has died down to some fraction of Vcreep maximum. This could be 50% of Vcreep maximum, 10% of Vcreep maximum, etc. The voltage Vsgh on the select lines is still greater than Vcreep at time t4, in some embodiments. Therefore, an electric field such as depicted in FIG. 1D may be maintained (although its magnitude may change over time). Hence, the threshold voltage of the various select transistors may be preserved.

Figure 10:
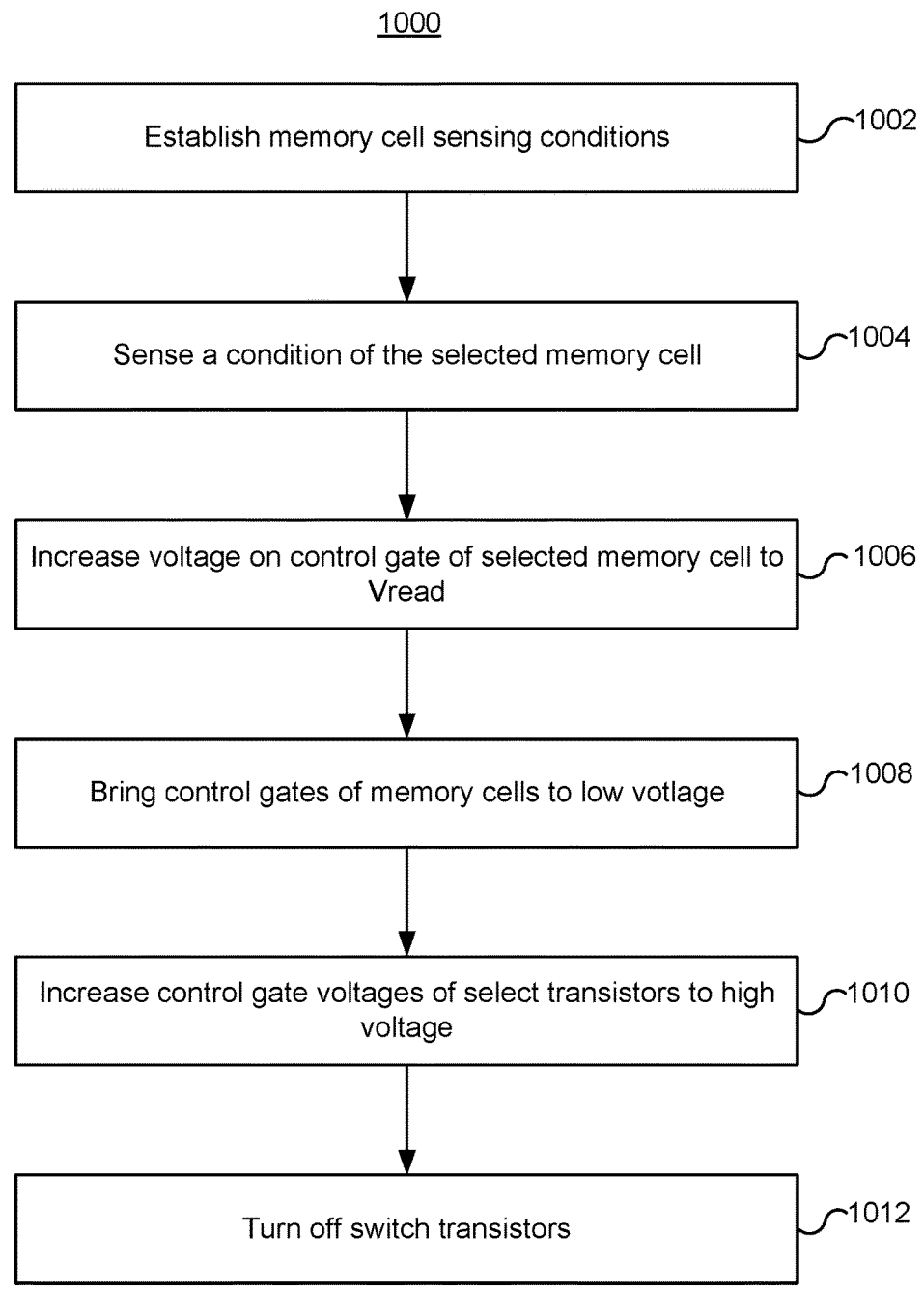
FIG. 10 is a flowchart of one embodiment of a process 1000 of operating non-volatile storage.

FIG. 10 is a flowchart of one embodiment of a process 1000 of operating non-volatile storage. Process 1000 explains further details of one embodiment of process 800. Process 1000 may be performed by a control circuit, which may include but is not limited to: control circuitry 110, state machine 112, decoders 114/124/132, power control module 116, sense blocks 150, read/write circuits 128, and controller 122. FIGS. 11A-11G depict timing a signals during one embodiment of process 1000. However, process 1000 is not limited to the timing depicted in FIGS. 11A-11G. Also note that the times t1-t7 in FIGS. 11A-11G do not correspond to times t1-t3 in FIGS. 9A-9D.

Step 1002 of process 1000 includes establishing memory cell sensing conditions. These conditions may be for sensing one memory cell on a NAND string. One or more NAND strings may be sensed concurrently. For example, with reference to FIG. 4F, zero or one NAND strings associated with each bit line might be sensed concurrently. As previously discussed, the block in FIG. 4F can be thought of as having four sub-blocks (SBA, SBB, SBC, SBD). Typically, one of the four sub-blocks is selected at a time (assuming that the block is selected). For the sake of discussion, it will be assumed that sub-block SBD is selected, and sub-blocks SBA, SBB, and SBC are unselected. A sub-block can be selected by applying suitable voltages to the control gates of the select transistors (SGD, SGS). Referring briefly to FIG. 7B, voltages may be applied to select line switch transistors 702a-702d and 710a-710d to apply suitable voltages to the control gates of the select transistors. Also, the block select line BLKSEL 720 may provide a voltage to turn on switch transistors 702 and 710.

Referring again to FIG. 4F, each of the bit lines 411-419 may be selected or unselected in step 1002 by applying a suitable voltage thereto. Selecting a bit line serves to select the NAND string in sub-block SBD. For the sake of example, the NAND string in sub-block SBD that is connected to bit line 411 will be discussed as being selected. The other NAND strings in sub-block SBD might or might not be selected, depending on their bit line voltages. In one embodiment, the combination of voltages applied to a selected select line and a selected bit line connects a selected NAND string to the bit line.

Also, for the sake of example, the memory cell at WLL46 on the selected NAND string will be used an example of a selected memory cell. In step 1002, a suitable sensing voltage is applied to WLL46. For example, one of the read reference voltages (Vr1-Vr7) in FIG. 5 might be applied to WLL46. Alternatively, one of the program verify reference voltages (Vv1-Vv7) in FIG. 5 might be applied to WLL46. Note that in some embodiments, up to all of the reference voltages are applied to WLL46 in succession. With reference to FIG. 7B, the one or more reference voltages may be applied to the drain of the word line switch 706(46) that provides voltages to WLL46. Also, the block select line BLKSEL 720 may provide a voltage to turn on that WL switch transistor 706(46).

Step 1002 may also include applying read pass voltages to unselected word lines, as well as dummy word lines. A read pass voltage is a voltage that is sufficient to place the memory cell into a conductive state, assuming that its threshold voltage is within a range of threshold voltages assigned to different data states. With reference to FIG. 7B, a read pass voltage may be applied to the drain of the dummy word line switches 704 and 708. A read pass voltage may also be applied to drain of the WL switch transistors 706 other than the WL switch transistor 706(46) that provides the reference voltage to the selected word line. Also, the block select line BLKSEL 720 may provide a voltage to turn on dummy word line switches 704 and 708, and the other word line switches 706.

The timing diagrams of FIG. 11A-11F at time t1 depict voltages on the conductive lines for one embodiment of step 1002. The conductive lines are in a selected block of memory cells. FIG. 11A represents the voltage on SDG_SEL, which corresponds to the drain side select line in the selected sub_block. With reference to FIG. 4F, this may correspond to SGD0D and SGD1D. FIG. 11A depicts Vsgd on SGD_SEL at time t1. This may be achieved by applying Vsgd to the drain of drain switch transistor 702d. The voltage Vsgd is sufficiently high to connect the selected NAND string to the bit line, in some embodiments. FIG. 11G indicates whether switch transistors 702-710 in FIG. 7B are on or off. At time t1, all of the switch transistors in the row decoder of the selected block are on, as represented in FIG. 11G.

FIG. 11D represents the voltage on SDS_SEL, which corresponds to the source side select line of the selected sub_block. With reference to FIG. 4F, this may correspond to SGS0D and SGS1D. FIG. 11D depicts Vsgs on SGS_SEL at time t1. This may be achieved by applying Vsgs to the drain of source switch transistor 710d. The voltage Vsgs is sufficiently high to connect the selected NAND string to the source line, in some embodiments.

FIG. 11B represents the voltage on Sel_WL, which corresponds to the selected word line. With reference to FIG. 4F, this may correspond to WLL47, in the present example. FIG. 11B depicts Vcgr on Sel_WL at time t1. This may be achieved by applying Vcgr to the drain of WL switch transistor 706(47). The voltage Vcgr may be one of the reference voltages in FIG. 5.

FIG. 11C represents the voltage on Unsel_WL and DWL, which corresponds to the unselected word lines and the dummy word line. With reference to FIG. 4F, this may correspond to DS0, DSS WLL0-WLL45, WLL47, DD1, and DD0. FIG. 11C depicts Vread on Unsel_WL and DWL at time t1. This may be achieved by applying Vread to the drains of WL switch transistors 704, 708, WL switch transistors 706(0)-706(45) and 706(47).

FIG. 11E represents the voltage on SDG_USEL, which corresponds to the drain side select lines of the unselected sub-blocks. With reference to FIG. 4F, this may correspond to SGD0A, SGD1A, SGD0B, SGD1B, SGD0C, and SGD1C. FIG. 11E depicts Vss on SGD_USEL at time t1. This may be achieved by applying Vss to the drain of drain switch transistors 702a, 702b, and 702c.

FIG. 11F represents the voltage on SDS_USEL, which corresponds to the source side select lines of the unselected sub-blocks. With reference to FIG. 4F, this may correspond to SGS0A, SGS1A, SGS0B, SGS1B, SGS0C, and SGS1C.

FIG. 11F depicts Vss on SGS_USEL at time t1. This may be achieved by applying Vss to the drain of drain switch transistors 710a, 710b, and 710c.

Step 1004 includes sensing a condition of the selected memory cell. In one embodiment, the conduction current of the selected memory cell is measured to determine whether the selected memory cell turned on (conducted current) in response to Vcgr applied to the control gate of the selected memory cell.

Step 1006 includes increasing a voltage on the control gate of the selected memory cell to Vread. Step 1006 may include increasing a voltage at an input of the selected WL switch to a read pass voltage. FIG. 11B between time t1 and t3 depicts results after one embodiment of step 1006. The voltage on Sel_WL is seen as rising to Vread between time t1 and t1, and being held there until time t4. With reference to FIG. 7B, the voltage on selected WL switch 706(47) may be increased to Vread.

Step 1008 includes bringing control gates of memory cells to a low voltage. Step 1008 may include bringing the input of the word line switches down to a low voltage. FIGS. 11B and 11C between time t4 and t7 depicts results after one embodiment of step 1008. The voltage on Sel_WL is seen as falling from Vread to Vss between time t4 and t5 and being held at Vss until time t7. Likewise, the voltage on Unsel_WL and DWL is seen as falling from Vread to Vss between time t4 and t5 and being held at Vss until time t7. With reference to FIG. 7B, the voltages at the drains of dummy WL switches 704, 708, and all WL switches 706 may decreased from Vread to Vss. Note that Vss is just one example of a low voltage. In one embodiment, Vss is ground. However, the low voltage is not required to be ground.

Step 1010 includes increasing control gate voltages of select transistors to a high voltage. Step 1010 may include increasing the input of the select line switches to a high voltage. Step 1010 applies to select line switches for both selected and unselected sub-blocks (in a selected block). FIG. 11A depicts the voltage on SGD_SEL going from Vsgd to VSGH between time t5 and t6. The voltage on SGD_SEL stays at VSGH between time t6 and t7. After time t7, SGD_SEL is floated, which will be discussed below. FIG. 11D depicts the voltage on SGS_SEL going from Vsgs to VSGH between time t5 and t6. The voltage on SGS_SEL stays at VSGH between time t6 and t7. After time t7, SGS_SEL is floated, which will be discussed below. FIG. 11E depicts the voltage on SGD_USEL going from Vss to VSGH between time t5 and t6. The voltage on SGD_USEL stays at VSGH between time t6 and t7. After time t7, SGD_USEL is floated, which will be discussed below. FIG. 11F depicts the voltage on SGS_USEL going from Vss to VSGH between time t5 and t6. The voltage on SGS_USEL stays at VSGH between time t6 and t7. After time t7, SGS_USEL is floated, which will be discussed below.

With reference to FIG. 7B, the voltage at the drain of drain select line switch 702d may be increased from Vsgd to VSGH at time t5. With reference to FIG. 7B, the voltages at the drains of drain select line switches 702a, 702b, and 702c may be increased from Vss to VSGH at time t5. With reference to FIG. 7B, the voltage at the drain of source select line switch 710d may be increased from Vsgs to VSGH at time t5. With reference to FIG. 7B, the voltages at the drains of source select line switches 710a, 710b, and 710c may be increased from Vss to VSGH at time t5.

Step 1012 includes turning off the switch transistors for the selected block. With reference to FIG. 7B, block select line BLKSEL 720 may be used to turn off switch transistors 702-710. FIGS. 11A-11G depict results of one embodiment of step 1012. At time t7, FIG. 11G depicts the switch transistors being turned off. This results in the conductive lines in the selected lines floating, in one embodiment. FIG. 11A depicts SGD_SEL floating at VSGH after time t7. FIG. 11D depicts SGS_SEL floating at VSGH after time t7. FIG. 11E depicts SGD_USEL floating at VSGH after time t7. FIG. 11F depicts SGS_USEL floating at VSGH after time t7.

The voltage on the word lines may creep up after the WL switch transistors are turned off. This is depicted in FIGS. 11B and 11C by the voltage on Sel_WL, Unsel_WL, and DWL creeping up to Vcreep after time t7. The voltage VSGH is at least as high as Vcreep in some embodiments. Note that time t7 in FIGS. 11A-11G corresponds to one embodiment of time t2 in FIGS. 9A-9D.

Thus, after time t7, an electric field may be created between a select transistor and an adjacent memory cell. This could be at a drain or source end of a NAND string, for example. The electric field may reduce or eliminate hole movement in a charge trapping material 473, which may preserve a threshold voltage of the select transistor.

A first embodiment disclosed herein includes an apparatus, comprising a NAND string comprising non-volatile memory cells, a string select line, a plurality of word lines connected to control gates of the non-volatile memory cells, and a control circuit in communication with the NAND string, the string select line, and the plurality of word lines. The control circuit is configured to: apply a read pass voltage to a word line adjacent to the string select line; decrease the read pass voltage on the adjacent word line to a steady state voltage after a selected memory cell on the NAND string is sensed; increase a voltage on the string select line after the voltage on the adjacent word line is decreased to the steady state voltage; and float the string select line and the adjacent word line after the voltage on the string select line is increased.

In a second embodiment, in furtherance of the first embodiment, the control circuit is further configured to increase the voltage on the string select line to at least a maximum creep up voltage to which the adjacent word line creeps up to after the adjacent word line is floated.

In a third embodiment, in furtherance of the first or second embodiments, control circuit is further configured to float the string select line at a higher voltage than a voltage at which the adjacent word line floats.

In a fourth embodiment, in furtherance of any of the first through third embodiments, the plurality of word lines comprise data word lines and a dummy word line. The adjacent word line is a dummy word line. The control circuit is further configured to float the data word lines along with the string select line and the dummy word line.

In a fifth embodiment, in furtherance of the fourth embodiment floating the data word lines and the dummy word line results in a voltage on the dummy word line creeping up to a creep up voltage due to capacitive coupling between a NAND string channel and the dummy word line.

In a sixth embodiment, in furtherance of any of the first through fifth embodiments, the string select line is an unselected string select line in a block of non-volatile memory cells comprising the NAND string.

In a seventh embodiment, in furtherance of any of the first through fifth embodiments, the string select line is a selected string select line in a block of non-volatile memory cells comprising the NAND string.

In an eighth embodiment, in furtherance of the seventh embodiment, the apparatus further comprises a bit line associated with the NAND string. The block of non-volatile memory cells further comprises: one or more unselected string select lines; and one or more additional NAND strings associated with the bit line. The plurality of word lines are further associated with the one or more additional NAND strings. Each of the additional NAND strings being associated with one of the unselected string select lines. The control circuit is further configured to: apply an unselect voltage to each of the unselected string select lines while the read pass voltage is applied to the adjacent word line; increase a voltage on each of the unselected string select lines after the voltage on the adjacent word line is decreased; and float voltages on each of the unselected string select lines after the increased voltages are on each of the unselected string select lines and the adjacent word line is floated.

In a ninth embodiment, in furtherance of any of the first through eighth embodiments, the NAND string resides in a three-dimensional memory array.

In a tenth embodiment, in furtherance of any of the first through ninth embodiments, the NAND string comprises a charge trapping material that extends contiguously between a select transistor having a control gate electrically connected to the select line and a memory cell adjacent to the select transistor.

An eleventh embodiment, in furtherance of any of the first through tenth embodiments, further comprises a string select line switch configured to transfer a voltage at an input of the string select line switch to the string select line; and a dummy word line switch configured to transfer a voltage at an input of the dummy word line switch to the adjacent word line. The control circuit is further configured to: turn off the string select line switch to float the string select line; and turn off the dummy word line switch to float the dummy word line.

One embodiment includes a method of operating non-volatile storage. The method comprises applying a select voltage to a control gate of a string select transistor while applying a read pass voltage to a control gate of a memory cell adjacent to the string select transistor, the adjacent memory cell and the string select transistor are part of a NAND string; sensing a selected non-volatile memory cell on the NAND string; after sensing the selected non-volatile memory cell, decreasing a voltage on the control gate of the adjacent memory cell from the read pass voltage to a steady state voltage; increasing a voltage on the control gate of the string select transistor after decreasing the voltage on the control gate of the adjacent memory cell to the steady state voltage; and after increasing the voltage on the control gate of the string select transistor, floating the control gate of the string select transistor while floating the control gate of the adjacent memory cell.

One embodiment includes a non-volatile storage device comprising: a NAND string comprising non-volatile memory cells and a string select transistor; selection means for applying a select voltage to a control gate of the string select transistor while applying a read pass voltage to a control gate of a dummy memory cell adjacent to the string select transistor; sensing means for sensing a selected non-volatile memory cell on the NAND string; first voltage applying means for decreasing a voltage on the control gate of the dummy memory cell from the read pass voltage to a steady state voltage after the selected non-volatile memory cell is sensed; second voltage applying means for increasing a voltage on the control gate of the string select transistor after the voltage on the control gate of the dummy memory cell is decreased to the steady state voltage; and floating means for floating the control gate of the string select transistor while floating the control gate of the dummy memory cell after the voltage on the control gate of the string select transistor is increased.

In one embodiment, the selection means comprises one or more of: control circuitry 110, state machine 112, decoders 114/124/132, switch transistors 702, 704, 708, 710 power control module 116, sense blocks 150, read/write circuits 128, and/or controller 122. The selection means could comprise other hardware and/or software.

In one embodiment, the sensing means comprises one or more of: control circuitry 110, state machine 112, decoders 114/124/132, power control module 116, sense blocks 150, read/write circuits 128, and/or controller 122. The sensing means could comprise other hardware and/or software.

In one embodiment, the first voltage applying means comprises one or more of: control circuitry 110, state machine 112, decoders 114/124/132, switch transistors 704, 708, power control module 116, and/or controller 122. The first voltage applying means could comprise other hardware and/or software.

In one embodiment, the second voltage applying means comprises one or more of: control circuitry 110, state machine 112, decoders 114/124/132, switch transistors 702a-702d, 710a-710d, power control module 116, and/or controller 122. The second voltage applying means could comprise other hardware and/or software.

In one embodiment, the floating means comprises one or more of: control circuitry 110, state machine 112, decoders 114/124/132, switch transistors 702a-702d, 704, 708, 710a-710d, power control module 116, and/or controller 122. The floating means could comprise other hardware and/or software.

For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a NAND string comprising non-volatile memory cells;
   a string select line;
   a plurality of word lines connected to control gates of the non-volatile memory cells; and
   a control circuit in communication with the NAND string, the string select line, and the plurality of word lines, the control circuit configured to:
      apply a read pass voltage to a word line adjacent to the string select line;
      decrease the read pass voltage on the adjacent word line to a steady state voltage after a selected memory cell on the NAND string is sensed;
      increase a voltage on the string select line after the voltage on the adjacent word line is decreased to the steady state voltage; and
      float the string select line and the adjacent word line after the voltage on the string select line is increased.

2. The apparatus of claim 1, wherein the control circuit is further configured to increase the voltage on the string select line to at least a maximum creep up voltage to which the adjacent word line creeps up to after the adjacent word line is floated.

3. The apparatus of claim 1, wherein the control circuit is further configured to float the string select line at a higher voltage than a voltage at which the adjacent word line floats.

4. The apparatus of claim 1, wherein the plurality of word lines comprise data word lines and a dummy word line, wherein the adjacent word line is a dummy word line, wherein the control circuit is further configured to:
   float the data word lines along with the string select line and the dummy word line.

5. The apparatus of claim 4, wherein floating the data word lines and the dummy word line results in a voltage on the dummy word line creeping up to a creep up voltage due to capacitive coupling between a NAND string channel and the dummy word line.

6. The apparatus of claim 1, wherein the string select line is an unselected string select line in a block of non-volatile memory cells comprising the NAND string.

7. The apparatus of claim 1, wherein the string select line is a selected string select line in a block of non-volatile memory cells comprising the NAND string.

8. The apparatus of claim 7, further comprising a bit line associated with the NAND string;
   wherein the block of non-volatile memory cells further comprises:
      one or more unselected string select lines; and
      one or more additional NAND strings associated with the bit line, wherein the plurality of word lines are further associated with the one or more additional NAND strings, each of the additional NAND strings being associated with one of the unselected string select lines;
   wherein the control circuit is further configured to:
      apply an unselect voltage to each of the unselected string select lines while the read pass voltage is applied to the adjacent word line;
      increase a voltage on each of the unselected string select lines after the voltage on the adjacent word line is decreased; and
      float voltages on each of the unselected string select lines after the increased voltages are on each of the unselected string select lines and the adjacent word line is floated.

9. The apparatus of claim 1, wherein the NAND string resides in a three-dimensional memory array.

10. The apparatus of claim 1, wherein the NAND string comprises a charge trapping material, wherein the charge trapping material extends contiguously between a select transistor having a control gate electrically connected to the select line and a memory cell adjacent to the select transistor.

11. The apparatus of claim 1, further comprising:
    a string select line switch configured to transfer a voltage at an input of the string select line switch to the string select line; and
    a dummy word line switch configured to transfer a voltage at an input of the dummy word line switch to the adjacent word line;
    wherein the control circuit is further configured to:
       turn off the string select line switch to float the string select line; and
       turn off the dummy word line switch to float the dummy word line.

12. A method of operating non-volatile storage, the method comprising:
    applying a select voltage to a control gate of a string select transistor while applying a read pass voltage to a control gate of a memory cell adjacent to the string select transistor, the adjacent memory cell and the string select transistor are part of a NAND string;
    sensing a selected non-volatile memory cell on the NAND string;
    after sensing the selected non-volatile memory cell, decreasing a voltage on the control gate of the adjacent memory cell from the read pass voltage to a steady state voltage;
    increasing a voltage on the control gate of the string select transistor after decreasing the voltage on the control gate of the adjacent memory cell to the steady state voltage; and
    after increasing the voltage on the control gate of the string select transistor, floating the control gate of the string select transistor while floating the control gate of the adjacent memory cell.

13. The method of claim 12, wherein increasing the voltage on the control gate of the string select transistor comprises:
    increasing the voltage on the control gate of the string select transistor to at least a maximum voltage to which the control gate of the adjacent memory cell creeps up to after floating the control gate of the adjacent memory cell.

14. The method of claim 12, wherein floating the control gate of the string select transistor while floating the control gate of the adjacent memory cell comprises:
    floating the control gate of the string select transistor at a higher voltage than a voltage at which the control gate of the adjacent memory cell floats.

15. The method of claim 12, wherein floating the control gate of the adjacent memory cell results in a crept up potential on the control gate of the adjacent memory cell due to capacitive coupling between a string channel and the control gate of the adjacent memory cell.

16. The method of claim 12, further comprising:
applying an unselect voltage to control gates of additional string select transistors while applying the read pass voltage to the control gate of the adjacent memory cell, the string select transistor and the additional string select transistors associated with the same bit line;
increasing a voltage on the control gate of each of the additional string select transistors after the voltage on the control gate of the adjacent memory cell is decreased; and
floating the control gate of each of the additional string select transistors while floating the control gate of the string select transistor and while floating the control gate of the adjacent memory cell.

17. The method of claim 12, wherein the NAND string comprises a charge trapping material, wherein the charge trapping material extends contiguously between the string select transistor and the adjacent memory cell.

18. A non-volatile storage device comprising:
a NAND string comprising non-volatile memory cells and a string select transistor;
selection means for applying a select voltage to a control gate of the string select transistor while applying a read pass voltage to a control gate of a dummy memory cell adjacent to the string select transistor;
sensing means for sensing a selected non-volatile memory cell on the NAND string;
first voltage applying means for decreasing a voltage on the control gate of the dummy memory cell from the read pass voltage to a steady state voltage after the selected non-volatile memory cell is sensed;
second voltage applying means for increasing a voltage on the control gate of the string select transistor after the voltage on the control gate of the dummy memory cell is decreased to the steady state voltage; and
floating means for floating the control gate of the string select transistor while floating the control gate of the dummy memory cell after the voltage on the control gate of the string select transistor is increased.

19. The non-volatile storage device of claim 18, wherein the second voltage applying means is further for increasing the voltage on the control gate of the string select transistor to at least a voltage to which the control gate of the dummy memory cell creeps up to after the control gate of the dummy memory cell is floated.

20. The non-volatile storage device of claim 18, wherein the floating means is further for floating the control gate of the string select transistor at a higher voltage than a voltage at which the control gate of the dummy memory cell floats.

* * * * *